(12) United States Patent
Uchida et al.

(10) Patent No.: US 6,545,942 B2
(45) Date of Patent: Apr. 8, 2003

(54) SEMICONDUCTOR MEMORY DEVICE AND INFORMATION PROCESSING UNIT

(75) Inventors: Toshiya Uchida, Kawasaki (JP); Shusaku Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/986,582

(22) Filed: Nov. 9, 2001

(65) Prior Publication Data

US 2002/0114210 A1 Aug. 22, 2002

(30) Foreign Application Priority Data

| Feb. 21, 2001 | (JP) | ........................................ | 2001-045545 |
| Feb. 23, 2001 | (JP) | ........................................ | 2001-048653 |
| Feb. 28, 2001 | (JP) | ........................................ | 2001-054567 |

(51) Int. Cl.$^7$ ................................................ G11C 8/00
(52) U.S. Cl. ............. 365/233; 365/230.03; 365/230.06
(58) Field of Search ........................... 365/233, 230.03, 365/230.06

(56) References Cited

U.S. PATENT DOCUMENTS

| 5,673,233 | A | * | 9/1997 | Wright et al. ................ 365/233 |
| 5,883,855 | A | * | 3/1999 | Fujita ........................... 365/233 |
| 5,901,304 | A | * | 5/1999 | Hwang et al. ................ 365/233 |
| 6,335,901 | B1 | * | 1/2002 | Morita et al. ................. 365/233 |
| 6,373,752 | B1 | * | 4/2002 | Wright et al. ............ 365/230.06 |

FOREIGN PATENT DOCUMENTS

| JP | 2000231788 A | 8/2000 |

* cited by examiner

Primary Examiner—Trong Phan
(74) Attorney, Agent, or Firm—Arent Fox Kintner Plotkin & Kahn, PLLC

(57) ABSTRACT

A semiconductor memory device and information processing unit that improve speed at which data is written in a semiconductor memory device. A transfer section transfers data in a burst mode. A transferred number setting section sets the number of a plurality of bits of data transferred in the burst mode. A write command input section receives an input write command. A timing section measures time which has elapsed after the write command being input. A write start time setting section sets time which elapses before the writing of data being begun, according to the number of bits of data set by the transferred number setting section.

17 Claims, 38 Drawing Sheets

| BL=2 | | | | | |
|---|---|---|---|---|---|
| FOR HIGH-ORDER BYTE | | | FOR LOW-ORDER BYTE | | |
| A0 | A1 | VWU | A2 | A3 | VWL |
| 0 | 0 | 0 | 0 | 0 | 0 |
| 1 | 0 | 1 | 1 | 0 | 1 |
| 0 | 1 | 2 | 0 | 1 | 2 |
| 1 | 1 | — | 1 | 1 | — |

FIG. 30

| BL=4 | | | | | |
|---|---|---|---|---|---|
| FOR HIGH-ORDER BYTE | | | FOR LOW-ORDER BYTE | | |
| A0 | A1 | VWU | A2 | A3 | VWL |
| 0 | 0 | 0 | 0 | 0 | 0 |
| 1 | 0 | 1 | 1 | 0 | 1 |
| 0 | 1 | 2 | 0 | 1 | 2 |
| 1 | 1 | 4 | 1 | 1 | 4 |

FIG. 31

| BL=8 | | | | | | | |
|---|---|---|---|---|---|---|---|
| FOR HIGH-ORDER BYTE | | | | FOR LOW-ORDER BYTE | | | |
| A0 | A1 | A2 | VWU | A3 | A4 | A5 | VWL |
| 0 | 0 | 0 | 0 | 0 | 0 | 0 | 0 |
| 1 | 0 | 0 | 1 | 1 | 0 | 0 | 1 |
| 0 | 1 | 0 | 2 | 0 | 1 | 0 | 2 |
| 1 | 1 | 0 | 4 | 1 | 1 | 0 | 4 |
| 0 | 0 | 1 | 8 | 0 | 0 | 1 | 8 |
| 1 | 0 | 1 | — | 1 | 0 | 1 | — |
| 0 | 1 | 1 | — | 0 | 1 | 1 | — |
| 1 | 1 | 1 | — | 1 | 1 | 1 | — |

FIG. 32

| BL=16 | | | | | | | |
|---|---|---|---|---|---|---|---|
| FOR HIGH-ORDER BYTE | | | | FOR LOW-ORDER BYTE | | | |
| A0 | A1 | A2 | VWU | A3 | A4 | A5 | VWL |
| 0 | 0 | 0 | 0 | 0 | 0 | 0 | 0 |
| 1 | 0 | 0 | 1 | 1 | 0 | 0 | 1 |
| 0 | 1 | 0 | 2 | 0 | 1 | 0 | 2 |
| 1 | 1 | 0 | 4 | 1 | 1 | 0 | 4 |
| 0 | 0 | 1 | 8 | 0 | 0 | 1 | 8 |
| 1 | 0 | 1 | 16 | 1 | 0 | 1 | 16 |
| 0 | 1 | 1 | — | 0 | 1 | 1 | — |
| 1 | 1 | 1 | — | 1 | 1 | 1 | — |

FIG. 33

SEMICONDUCTOR MEMORY DEVICE AND INFORMATION PROCESSING UNIT

BACKGROUND OF THE INVENTION

1. Field of the Invention

This invention relates to a semiconductor memory device and information processing unit and, more particularly, to a semiconductor memory device having a burst mode, in which a plurality of bits of data are consecutively transferred in block in response to an external command, and information processing unit having such a semiconductor memory device.

2. Description of the Related Art (First Prior Art)

With what is called an I/O common semiconductor memory device in which written data and read data flow along the same data bus, the data bus can be used effectively by setting write latency, being delay time between the inputting of a write command and the writing of data to be written.

FIG. 34 is a timing chart showing how to transfer data in the case of write latency not being set. FIG. 35 is a timing chart showing how to transfer data in the case of write latency being set.

FIG. 34 is a view showing a read-write-read (RD-WR-RD) cycle in the case of burst length being "2" and write latency being "0." In this example, an RD command is input in synchronization with the leading edge of the zeroth clock (CLK) shown in FIG. 34(A) (see FIG. 34(B)). With most semiconductor memory devices, certain access time is needed between the inputting of an RD command (CMD) and the sending of data to a bus. In this example, as shown in FIG. 34(C), bits of read data (DATA) Q1 and Q2 are sent to a data bus at the leading edge of the third clock, that is to say, when three clocks have elapsed after the inputting of the RD command.

After the bits of read data are sent, a WR command is input at the leading edge of the fifth clock. The write latency is "0," so bits of written data D1 and D2 are input via the data bus almost concurrently with the inputting of the WR command.

The following RD command is input directly after the WR command, because there exists a delay corresponding to access time between the inputting of an RD command and the sending of data to the data bus and the data bus will not be congested with written data and read data.

As stated above, if the write latency is set to "0," RD—RD cycle time from an RD command to the next RD command is six clocks.

FIG. 35 is a view showing an RD-WR-RD cycle in the case of burst length being "2" and write latency being "3." In this example, an RD command is input in synchronization with the leading edge of the zeroth clock shown in FIG. 35(A) (see FIG. 35(B)). As stated above, with a semiconductor memory device, certain access time is needed between the inputting of an RD command and the sending of data to a bus. In this example, the bits of read data Q1 and Q2 are sent to the data bus at the leading edge of the third clock (see FIG. 35(C)).

If write latency is set, there exists a delay between the inputting of a WR command and the inputting of written data. A WR command therefore can be read prior to the sending of read data. In this example, a WR command is input at the leading edge of the second clock.

After the WR command is input and clocks corresponding to the write latency (three clocks, in this example) have elapsed, written data is read. In this example, the bits of written data D1 and D2 are read at the leading edge of the fifth clock.

The following RD command is input directly after the WR command, because, as stated above, there exists a delay corresponding to access time between the inputting of an RD command and the sending of data to the data bus and the data bus will not be congested with written data and read data. Read data corresponding to this RD command is read at the leading edge of the sixth clock.

As described above, if the write latency is set to "3," RD—RD cycle time from an RD command to the next RD command is three clocks. As a result, RD—RD cycle time can be shortened by three clocks in comparison to the above case where the write latency is set to "0."

(Second Prior Art)

Bank interleaving is one of techniques for realizing high-speed access to a semiconductor memory device.

With the bank interleaving technique, the whole of a memory is divided into a plurality of banks and is managed. When a CPU begins to access one of the banks, it begins to access another bank to be accessed next. By the time the first access by the CPU ends, the bank accessed next by the CPU is in a state in which data can already be transferred. The CPU therefore can transfer data without delay.

FIG. 36 is a timing chart showing operation for conventional bank interleaving. FIG. 37 is a view showing an example of circuits for realizing such bank interleaving.

A CLK (clock) input terminal 201 shown in FIG. 37 receives a CLK signal input from the outside. A CMD (command) input terminal 202 receives a CMD signal input from the outside. An ADD (address) input terminal 203 receives an ADD signal input from the outside.

A CLK input circuit 204 provides the CLK signal input from the CLK input terminal 201 to a CMD input circuit 205, ADD input circuit 206, and burst length counter 209.

The CMD input circuit 205 performs waveform shaping on the CMD signal input from the CMD input terminal 202 and provides it to a CMD decoder 207.

The ADD input circuit 206 performs waveform shaping on the ADD signal input from the ADD input terminal 203 and provides it to a burst length judging circuit 208, burst address generating circuit 210, and address importing circuit 211.

The CMD decoder 207 decodes the CMD signal, extracts an RD (read) command, WR (write) command, and NOP (no operation) command from it, and provides them to the burst length counter 209 and address importing circuit 211.

If a command for setting a burst length is input at the time of, for example, starting a device, the burst length judging circuit 208 analyzes the command and judges the set burst length.

When the RD command or WR command is input and a burst transfer is begun, the burst length counter 209 resets the burst address generating circuit 210, counts the burst length in response to the CLK signal, and requests the burst address generating circuit 210 to count up a burst address. Furthermore, when the count reaches the burst length, the burst length counter 209 requests the burst address generating circuit 210 to end generating the burst address.

The address importing circuit 211 refers to the CMD signal supplied from the CMD decoder 207 and, at the time of the burst transfer being begun, selects the ADD signal supplied from the ADD input circuit 206 to output it as an internal address IADD. Furthermore, in order to transfer the second bit and the following lower-order bits, the address importing circuit 211 selects output from the burst address generating circuit 210 and outputs it as the internal address IADD.

Now, operation for the above conventional bank interleaving will be described with reference to FIG. 36.

It is assumed that a device is started, that an MRS (mode register set) command for setting a burst length is input to the CMD input terminal 202, and that data showing the burst length to be set is input to the ADD input terminal 203. Then the CMD decoder 207 recognizes that a request to set the burst length was made and informs the burst length judging circuit 208 of it.

The burst length judging circuit 208 refers to data supplied from the ADD input circuit 206 and judges the burst length to be set. For example, if a request to set a burst length to "4" is made, the burst length judging circuit 208 recognizes it and informs the burst length counter 209 of it. As a result, the setting of burst length will be completed.

In this state of things, it is assumed that an RD1 command to request a burst transfer with a predetermined bank as a target (see FIG. 36(B)) is input to the CMD input terminal 202 at the zeroth leading edge of a CLK signal shown in FIG. 36(A). Then the CMD decoder 207 receives this signal via the CMD input circuit 205, recognizes that an RD command was input, and informs the burst length counter 209 and address importing circuit 211 of it.

The burst length counter 209 informs the burst address generating circuit 210 that a request for a burst transfer was made, and causes it to set a leading address for the burst transfer.

The burst address generating circuit 210 obtains a leading address for the burst transfer from the ADD input circuit 206 in response to the request from the burst length counter 209, counts up an address in response to a request from the burst length counter 209 to count up, and provides it to the address importing circuit 211 as a burst address (BADD).

The address importing circuit 211 obtains the leading address for the burst transfer directly from the ADD input circuit 206 and outputs it as an internal address IADD. Furthermore, in order to transfer the second bit and the following lower-order bits of data, the address importing circuit 211 selects the BADD output from the burst address generating circuit 210 as an address and outputs it as the internal address IADD.

Bits of data will be read from a series of addresses generated in this way and be output consecutively to the outside (see FIG. 36(C)).

In the above example, the burst transfer is requested by the RD1 command. Therefore, after predetermined access time has elapsed, bits of data Q11 through Q14 will be read from cells (not shown) and be output.

(Third Prior Art)

To read data from or write data to a semiconductor memory device, addresses to be accessed must be specified. With a semiconductor memory device having a burst transfer mode, specifying only the leading address of consecutive addresses will enable access to all of them.

With some semiconductor memory devices having such a burst transfer mode, the burst length of data to be written can be set. FIG. 38 is a view for describing the operation of such a semiconductor memory device. It is assumed that the maximum physical burst length for this semiconductor memory device is "4."

It is assumed that a WR1 command to request writing (see FIG. 38(B)) is input and that VW=1 (burst length=1) (see FIG. 38(D)) is input from an address input terminal as a variable write (VW) signal for specifying the burst length. In this case, they are input in synchronization with the zeroth leading edge of a clock (CLK) signal shown in FIG. 38(A).

Then after time corresponding to latency (see FIG. 38(C)) has elapsed, bits of data D11 through D14 are read from the DATA input terminal, which can include data D11-D14, D21-D23 and D31-D34. In this example, the burst length is set to "1," so the bit of data D11 will be sent only to the internal data bus #1 of internal data buses #1 through #4 (FIGS. 38(E) through 38(H)).

The bit of data D11 sent to the internal data bus #1 is stored in a predetermined bit at a predetermined address.

When time corresponding to a bank access interval (see FIG. 38(B)) has elapsed after the WR1 command being input, a WR2 command is input in synchronization with the second leading edge of the CLK signal. After time corresponding to the latency has elapsed, bits of data D21 through D24 and VW=4 are input. As a result, the bits of data D21 through D24 are sent to the internal data buses #1 through #4 respectively. The bits of data D21 through D24 sent to the internal data buses #1 through #4 in this way are stored in predetermined bits, respectively, at consecutive addresses.

When time corresponding to the bank access interval has elapsed after the WR2 command being input, a WR3 command and VW=2 are input. As a result, bits of data D31 and D32 are sent to the internal data buses #1 and #2 respectively.

The bits of data D31 and D32 sent to the internal data buses #1 and #2 in this way are stored in predetermined bits, respectively, at consecutive addresses.

By the way, in the first prior art, a case where a burst length is "2" was described as an example. In many cases, however, this value can be set freely.

However, a change in a burst length can lead to a change in the optimum value of write latency. Conventionally, write latency has not changed with a change in a burst length.

As a result, a change in a burst length can make it impossible to perform optimum write operation.

In the second prior art, an interrupt during a burst transfer has been enabled. That is to say, if another command is input during a burst transfer, execution of a command which is being executed at that time is stopped to preferentially execute the last command.

A concrete description of this is as follows. It is assumed that an RD2 command shown in FIG. 36 is input and that an RD3 command is input during the transfer of data corresponding to the RD2 command. In this case, when the transfer of a bit of data Q22 corresponding to the RD2 command is completed, interleaving is performed and the transfer of a bit of data Q31 corresponding to the RD3 command is begun.

To permit such interleaving, however, a command newly input must also be checked during a burst transfer. Moreover, if a request for a burst transfer is made, the process of selecting one of an ADD from the ADD input circuit 206 and BADD from the burst address generating circuit 210 must be performed. This will need the above judging process, which makes it impossible to ensure a sufficient margin for high-speed operation.

In addition, usually semiconductor memory devices have a data bus of bit width corresponding to the maximum burst length that can be set. For example, if the maximum burst length is four bits, then most semiconductor memory devices have a data bus with a width of four bits.

By the way, if a burst length is set to four bits, data should be transferred during time needed for sending 4-bit data (2 CLKs, for example). If a burst length is set to two bits, data should be transferred during time needed for sending 2-bit data (1 CLK, for example). Therefore, if the minimum burst length is set, it is difficult to ensure a margin for operation, resulting in unsuitableness for high-speed operation.

In the third prior art, with not a few semiconductor memory devices having a plurality of DATA input terminals, the DATA input terminal group is divided into a high-order bit group and low-order bit group and burst lengths for them are set independently of each other.

In these semiconductor memory devices, a request to write data only to one of a high- and low-order bit group can be made. Conventional semiconductor memory devices have no means to prohibit writing the data to the other bit group, so unnecessary data will be written.

Furthermore, when a first write command is input, not a few semiconductor memory devices with latency for write operation hold data without writing it to a cell. When a second write command is input, they write the data corresponding to the first write command to a cell.

If tests are made to check whether or not the write operation of these semiconductor memory devices is normal, a write command must be issued twice to cause them to write data to a cell. As stated above, conventional semiconductor memory devices have no means to prohibit writing data. Therefore, writing performed in compliance with the first write command can interfere with writing performed in compliance with the second write command. Eliminating this interference will make the tests troublesome.

SUMMARY OF THE INVENTION

The present invention was made under the background circumstances as described above. That is to say, an object of the present invention is to provide a semiconductor memory device which can set optimum write latency according to a burst length.

Another object of the present invention is to provide a semiconductor memory device which enables high-speed operation.

Still another object of the present invention is to provide a semiconductor memory device which enables to write data to a cell by the bit group.

In order to solve the above problems, a semiconductor memory device having a burst mode in which a plurality of bits of data are transferred consecutively in response to an external command is provided by the present invention. This semiconductor memory device comprises transfer means for transferring data in the burst mode, transferred number setting means for setting the number of the plurality of bits of data transferred in the burst mode, write command input means for receiving an input write command, timing means for measuring time which has elapsed after the write command being input, and write start time setting means for setting time which elapses before the writing of data being begun, according to the number of bits of data set by the transferred number setting means.

In order to solve the above problems, a semiconductor memory device with a plurality of banks having a burst transfer mode in which a plurality of bits of data in a predetermined bank are accessed consecutively by inputting a single command is also provided by the present invention. This semiconductor memory device comprises command input means for receiving the command input, bank selection means for selecting a predetermined bank corresponding to the command, burst transfer means for performing a burst transfer with a bank selected by the bank selection means as a target, and command input prohibition means for prohibiting the command input means from receiving a new command input in the case of a burst transfer being begun by the burst transfer means.

In order to solve the above problems, a semiconductor memory device having a burst transfer mode in which a plurality of bits of data are transferred consecutively by specifying one address is also provided by the present invention. This semiconductor memory device comprises address input means for receiving the address input, data input means for receiving the plurality of bits of data input, burst transfer means for performing a burst transfer of the plurality of bits of data input via the data input means to a cell area corresponding to the address input via the address input means, burst transfer length specifying means for receiving transfer length specified by the burst transfer means, and data input limiting means for limiting data input from the data input means in the case of a burst transfer length of "0" being specified by the burst transfer length specifying means.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 30 is a view showing an example of a method for assigning a VWU and VWL to column addresses in the case of burst length being "2."

FIG. 31 is a view showing an example of a method for assigning a VWU and VWL to column addresses in the case of burst length being "4."

FIG. 32 is a view showing an example of a method for assigning a VWU and VWL to column addresses in the case of burst length being "8."

FIG. 33 is a view showing an example of a method for assigning a VWU and VWL to column addresses in the case of burst length being "16."

DESCRIPTION OF THE PREFERRED EMBODIMENTS

Embodiments of the present invention will now be described with reference to the drawings.

(First Embodiment)

Figure 1:
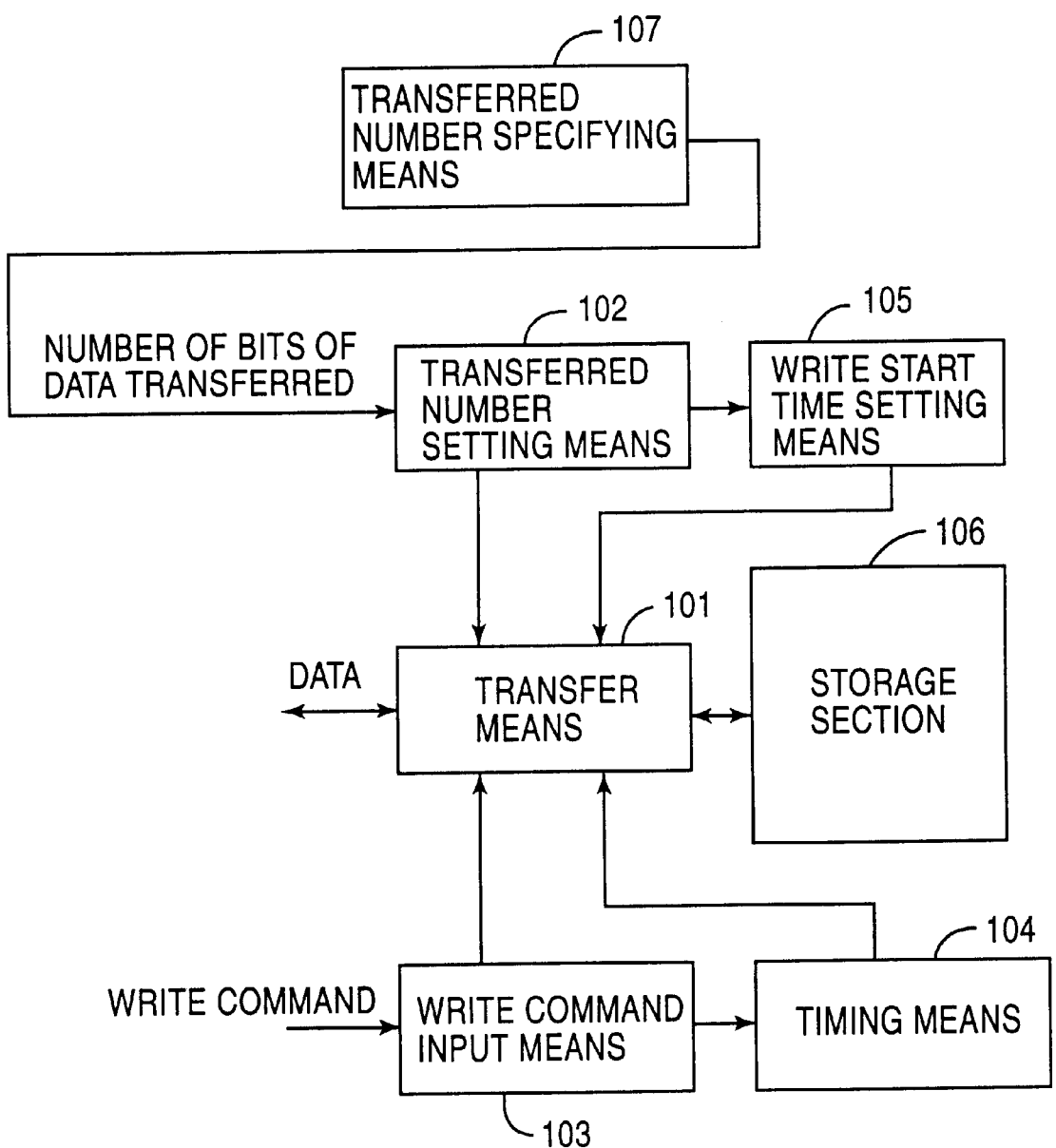
FIG. 1 is a view for describing the operative principles of the present invention.

FIG. 1 is a view for describing the operating principles of the present invention. As shown in FIG. 1, a semiconductor memory device according to the present invention comprises transfer means 101, transferred number setting means 102, write command input means 103, timing means 104, write start time setting means 105, and a storage section 106.

The transfer means 101 transfers data in the burst mode.

The transferred number setting means 102 sets the number of bits of data transferred in the burst mode from a transferred number specifying means 107.

The write command input means 103 receives an input write command.

The timing means 104 measures time which has elapsed after the write command being input.

The write start time setting means 105 sets time which elapses before the writing of data being begun, according to the number of bits of data set by the transferred number setting means 102.

Now, operation performed in FIG. 1 will be described. The relationship between a burst length and write latency will be described briefly, then the operation performed in FIG. 1 will be described.

(1) Optimum Value of Write Latency

Figure 2:
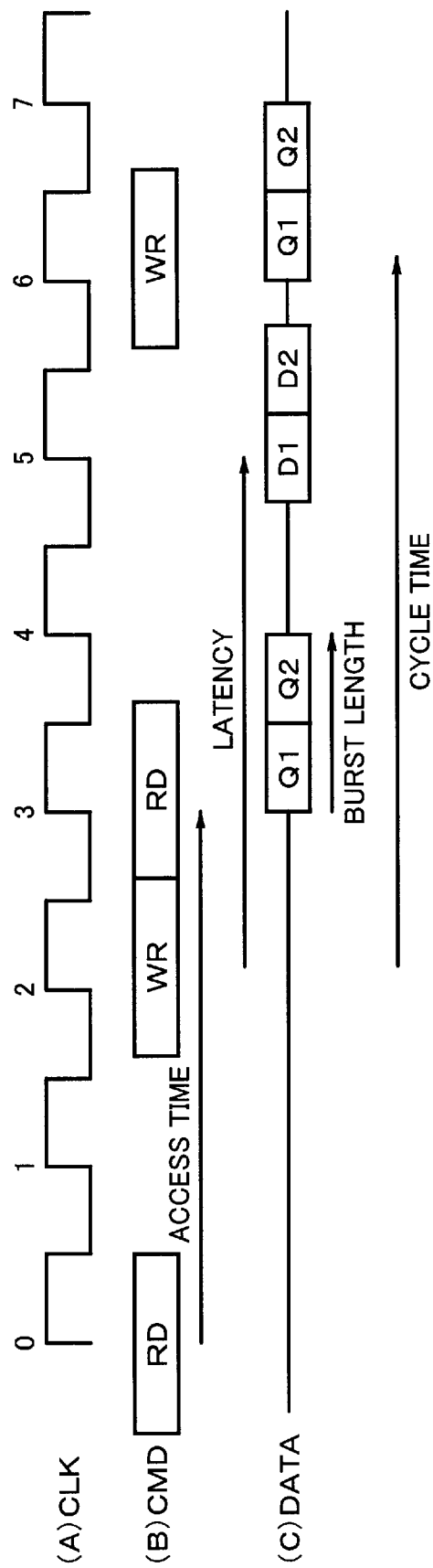
FIG. 2 is a timing chart for describing write operation in the case of burst length being "2" and write latency being "3."
Figure 3:
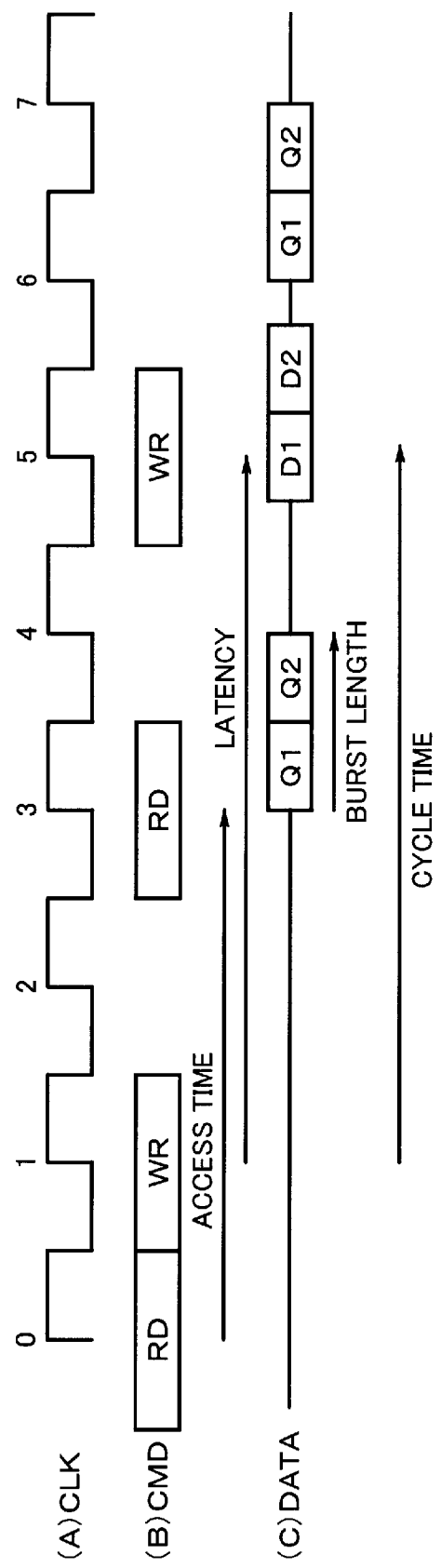
FIG. 3 is a timing chart for describing write operation in the case of burst length being "2" and write latency being "4."

FIG. 2 is a view for describing the operation of a semiconductor memory device in the case of burst length being "2" and write latency being "3." FIG. 3 is a view for describing its operation in the case of burst length being "2" and write latency being "4."

With most semiconductor memory devices having write latency, there exists a time interval between the inputting of a write command and the inputting of data. As a result, it is impossible to begin write operation the moment a write command is input.

Therefore, when a write command to write data to a bank is input, only the operation of importing data to be written input after predetermined write latency is performed. In this case, actual write operation will be performed next time a write command to write data to the same bank is input.

The shortest interval at which two write commands to write data to the same bank are input corresponds to the cycle time of a semiconductor memory device. Therefore, all the data corresponding to the last write command must be received in the cycle time and it is impossible to make latency for data to be written longer than need be.

FIGS. 2 and 3 show write operation in the case of cycle time being "4." If the write latency is "3"(see FIG. 2), the inputting of data will be completed in the given cycle time (see (C)). Therefore, even when a write command is input immediately after a lapse of the cycle time (see (B)), writing is possible.

However, if write latency is "4"(see FIG. 3), the inputting of all the data will not be completed in the cycle time (see (C)). Therefore, when a write command is input immediately after a lapse of the cycle time (see (B)), writing is impossible.

This shows that with this semiconductor memory device, write latency cannot be set to a value greater than "3."

(2) Relationship Between Burst Length and Write Latency

Figure 4:
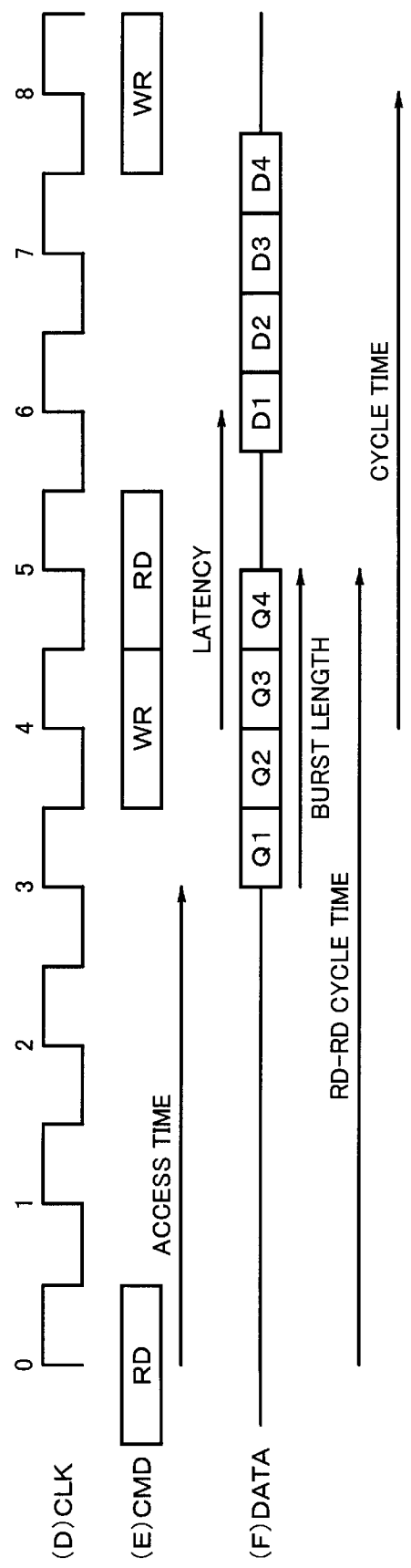
FIG. 4 is a timing chart for describing write operation in the case of burst length being "4" and write latency being "2."
Figure 5:
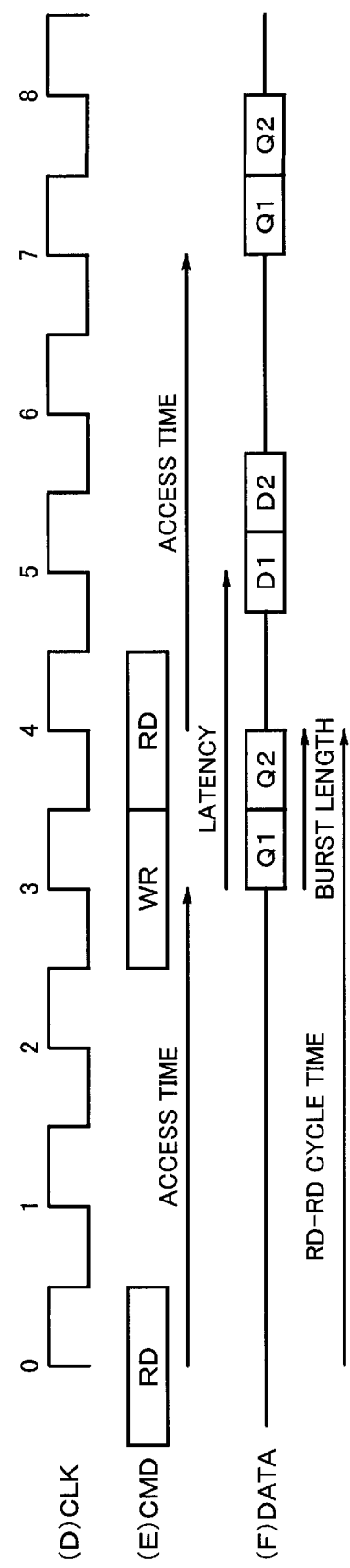
FIG. 5 is a timing chart for describing write operation in the case of burst length being "2" and write latency being "2."

FIG. 4 is a view for describing the operation of a semiconductor memory device in the case of burst length being "4" and write latency being "2." FIG. 5 is a view for describing its operation in the case of burst length being "2" and write latency being "2."

If a burst length is "4"(see FIG. 4), write latency must be smaller than or equal to "2" in order to complete the inputting of all the data in cycle time.

On the other hand, if a burst length is "2" and write latency is set to "2"(see FIG. 5), RD—RD cycle time will be extended from "3" to "4."

This shows that there exists an optimum value of write latency according to burst length.

On the basis of the above consideration, operation in FIG. 1 will now be described.

If the transferred number setting means 102 receives the number of bits of data transferred (that is to say, burst length) set outside, the number set is provided to the write start time setting means 105.

The write start time setting means 105 calculates write start time (that is to say, write latency) corresponding to the number of bits of data transferred which was supplied from the transferred number setting means 102, and sets the transfer means 101 to that value. As shown in FIG. 4, for example, if burst length is "4," write latency will be set to "2."

In this state of things, it is assumed that a write command is input to the write command input means 103. Then the write command input means 103 informs the transfer means 101 and timing means 104 of it.

The timing means 104 measures time which has elapsed after the write command being input, and informs the transfer means 101 of it.

The transfer means 101 refers time of which the timing means 104 informs it. When time which has elapsed after the write command being input becomes equal to time of which the write start time setting means 105 informs it, the transfer means 101 begins to transfer data to the storage section 106. As a result, optimum write start time will be set according to the number of bits of data transferred.

As stated above, in the present invention, when a write command is input, bits of data are transferred to the storage section 106 after waiting for predetermined time according to the number of the bits of data to be transferred. This enables optimum transfer according to the number of bits of data transferred.

An embodiment of the present invention will now be described.

Figure 6:
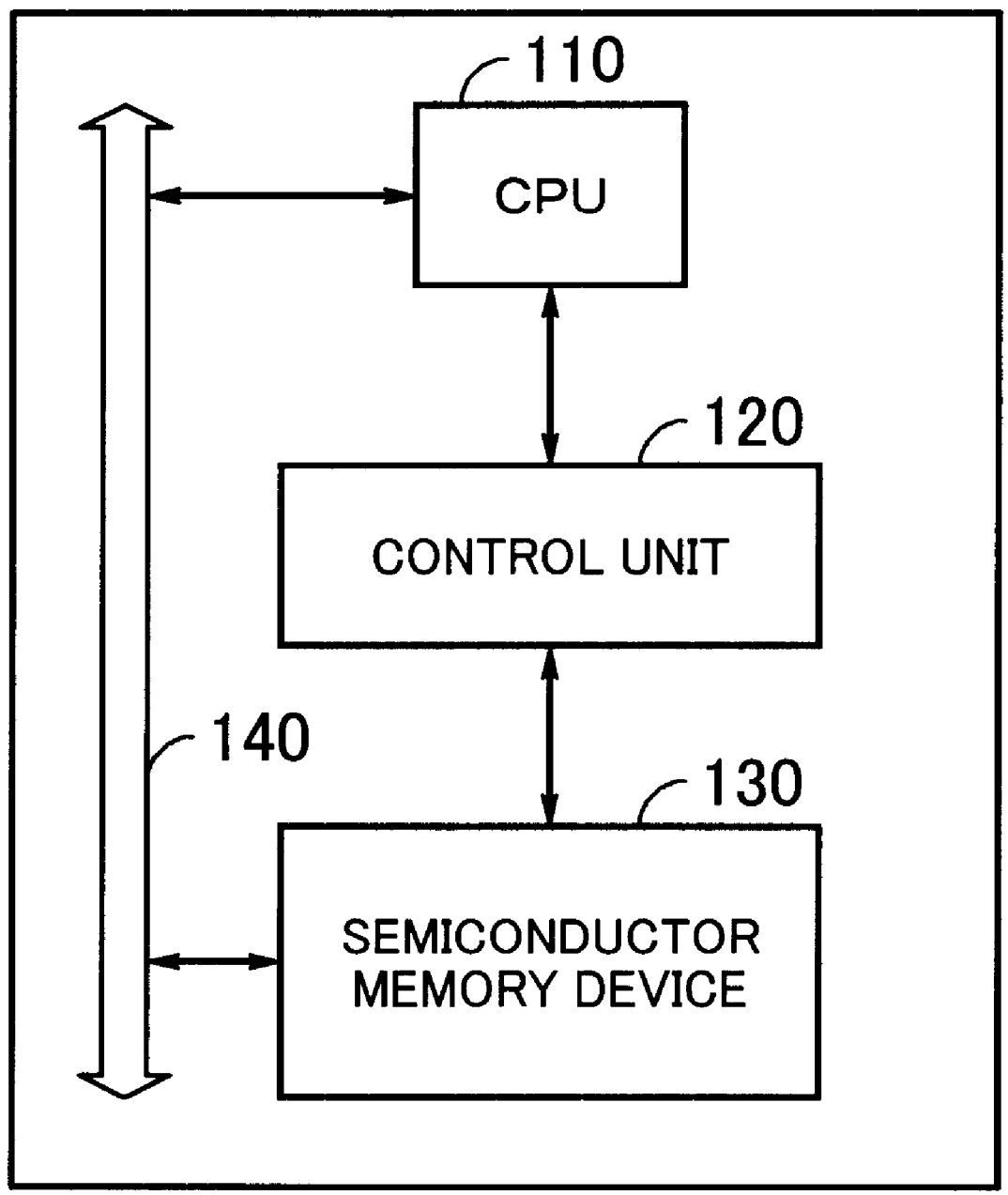
FIG. 6 is a view showing the structure of an embodiment of the present invention.

FIG. 6 is a view showing the structure of an embodiment of an information processing unit according to the present invention. As shown in FIG. 6, an information processing unit according to the present invention comprises a central processing unit (CPU) 110, a control unit 120, a semiconductor memory device 130, and a bus 140.

By executing various programs etc. stored in the semiconductor memory device 130, the CPU 110 controls each section of the unit and performs various operations.

The control unit 120 controls operation regarding setting burst length, refreshing, etc. for the semiconductor memory device 130.

The semiconductor memory device 130 stores data supplied from the CPU 110 and provides the CPU 110 with its stored data, under the control of the control unit 120.

The bus 140 provides data from the CPU 110 to the semiconductor memory device 130 and provides data from the semiconductor memory device 130 to the CPU 110.

Figure 7:
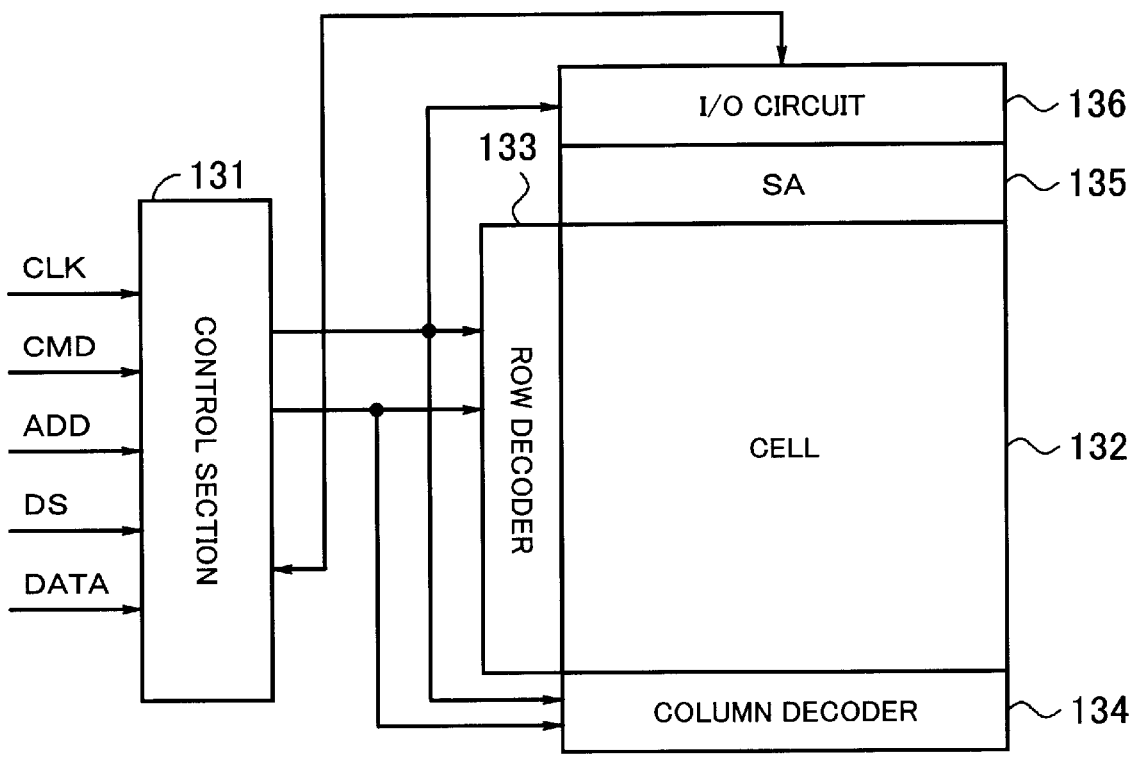
FIG. 7 is a view showing the structure of the semiconductor memory device shown in FIG. 6.

FIG. 7 is a view showing the detailed structure of the semiconductor memory device 130 shown in FIG. 6.

As shown in FIG. 7, the semiconductor memory device 130 comprises a control section 131, a cell 132, a row decoder 133, a column decoder 134, a sense amplifier (SA) 135, and an input-output (I/O) circuit 136.

The control section 131 inputs a clock (CLK) signal, command (CMD) signal, address (ADD) signal, data strobe (DS) signal and DATA signal and provides them to each section of the device. Moreover, the control section 131 reads data with predetermined timing in the case of writing. Furthermore, in the case of reading, the control section 131 reads data from a predetermined address and outputs it.

The cell 132 includes a group of storage elements arranged like a matrix and stores input data.

The row decoder 133 specifies a predetermined row in the cell 132 on the basis of a row address.

The column decoder 134 specifies a predetermined column in the cell 132 on the basis of a column address.

The SA 135 amplifies a signal read from the cell 132 by a predetermined gain and converts it to a digital one.

The I/O circuit 136 controls operation regarding inputting and outputting data.

Figure 8:
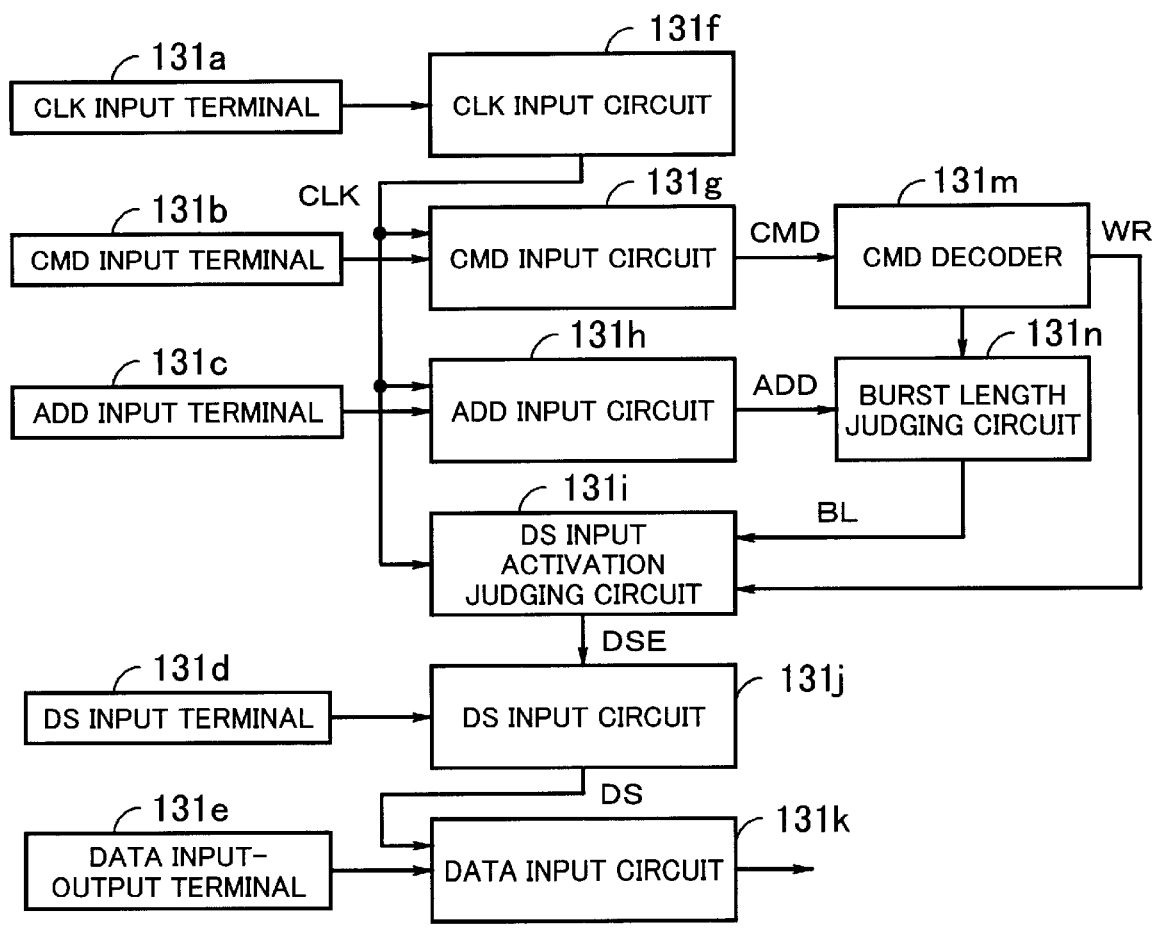
FIG. 8 is a view showing the structure of the control section shown in FIG. 7.

FIG. 8 is a view showing the detailed structure of the control section 131 shown in FIG. 7.

As shown in FIG. 8, the control section 131 comprises a CLK input terminal 131a, a CMD input terminal 131b, an ADD input terminal 131c, a DS input terminal 131d, a DATA input-output terminal 131e, a CLK input circuit 131f, a CMD input circuit 131g, an ADD input circuit 131h, a DS input activation judging circuit 131i, a DS input circuit 131j, a DATA input circuit 131k, a CMD decoder 131m, and a burst length judging circuit 131n.

The CLK input terminal 131a receives a CLK signal input. The CMD input terminal 131b receives a CMD signal input. The ADD input terminal 131c receives an ADD signal input. The DS input terminal 131d receives a DS signal input. The DATA input-output terminal 131e receives a DATA signal input and outputs a DATA signal.

The CLK input circuit 131f includes a buffer etc. and provides the CLK signal input from the CLK input terminal 131a to the CMD input circuit 131g, ADD input circuit 131h, and DS input activation judging circuit 131i.

In synchronization with the CLK signal, the CMD input circuit 131g obtains the CMD signal input from the CMD input terminal 131b and provides it to the CMD decoder 131m.

In synchronization with the CLK signal, the ADD input circuit 131h obtains the ADD signal input from the ADD input terminal 131c and provides it to the burst length judging circuit 131n.

When a WR signal is output from the CMD decoder 131m, the DS input activation judging circuit 131i waits for a predetermined write latency according to the burst length (BL) judged by the burst length judging circuit 131n and then makes a data strobe enable (DSE) signal active.

When the DSE signal supplied from the DS input activation judging circuit 131i becomes active, the DS input circuit 131j inputs the DS signal from the DS input terminal 131d and provides it to the DATA input circuit 131k.

When the DS signal is supplied from the DS input circuit 131j, the DATA input circuit 131k inputs data from the DATA input-output terminal 131e and provides it to the I/O circuit 136 shown in FIG. 7.

The CMD decoder 131m decodes the CMD signal input from the CMD input circuit 131g. If it is the write (WR) command, then the CMD decoder 131m provides it to the DS input activation judging circuit 131i. If it is a command to set a burst length (burst length setting command), then the CMD decoder 131m provides it to the burst length judging circuit 131n.

When the burst length setting command is supplied from the CMD decoder 131m, the burst length judging circuit 131n judges the burst length by referring to data supplied from the ADD input circuit 131h and provides it to the DS input activation judging circuit 131i.

Figure 9:
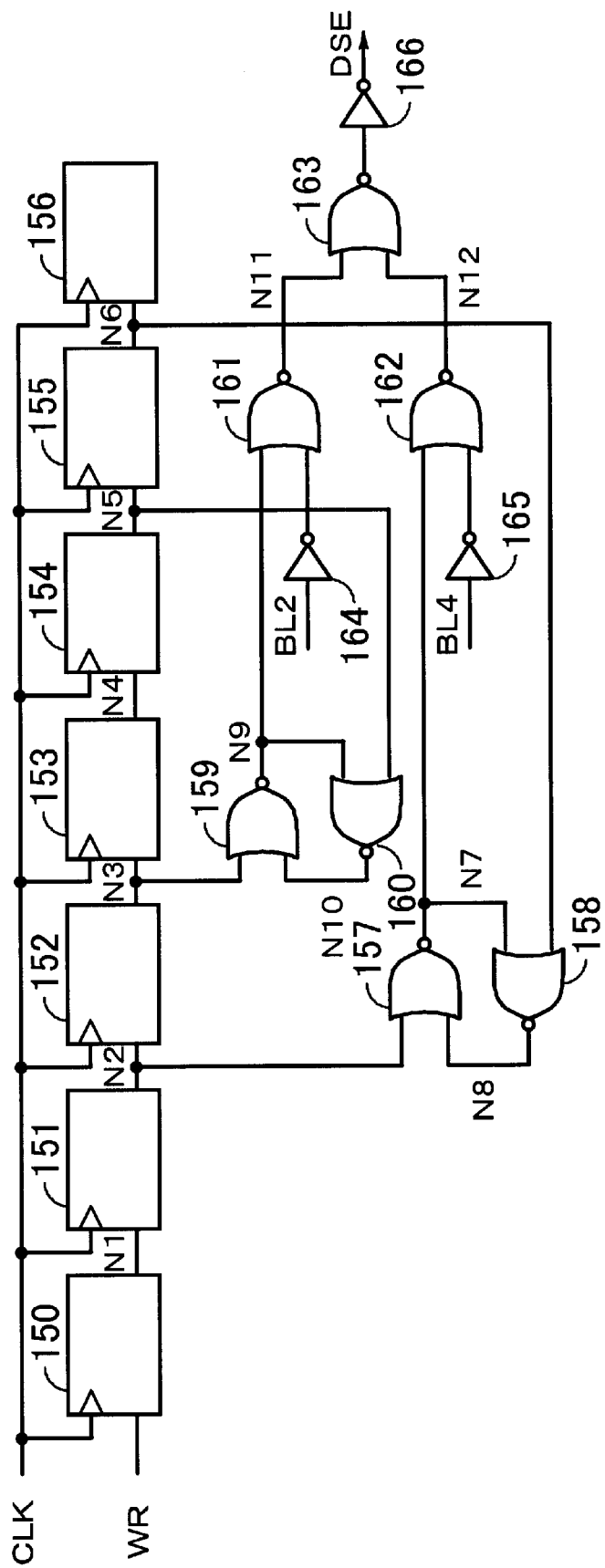
FIG. 9 is a view showing the structure of the DS input activation judging circuit shown in FIG. 8.

FIG. 9 is a view showing the detailed structure of the DS input activation judging circuit 131i shown in FIG. 8. As shown in FIG. 9, the DS input activation judging circuit 131i comprises data flip-flops (DFF) 150 through 156, NOR elements 157 through 163, and inverters 164 through 166.

In synchronization with the trailing edge of a CLK signal, each of the DFFs 150 through 156 outputs a signal output from a circuit at the preceding stage to a circuit at the following stage.

Figure 10:
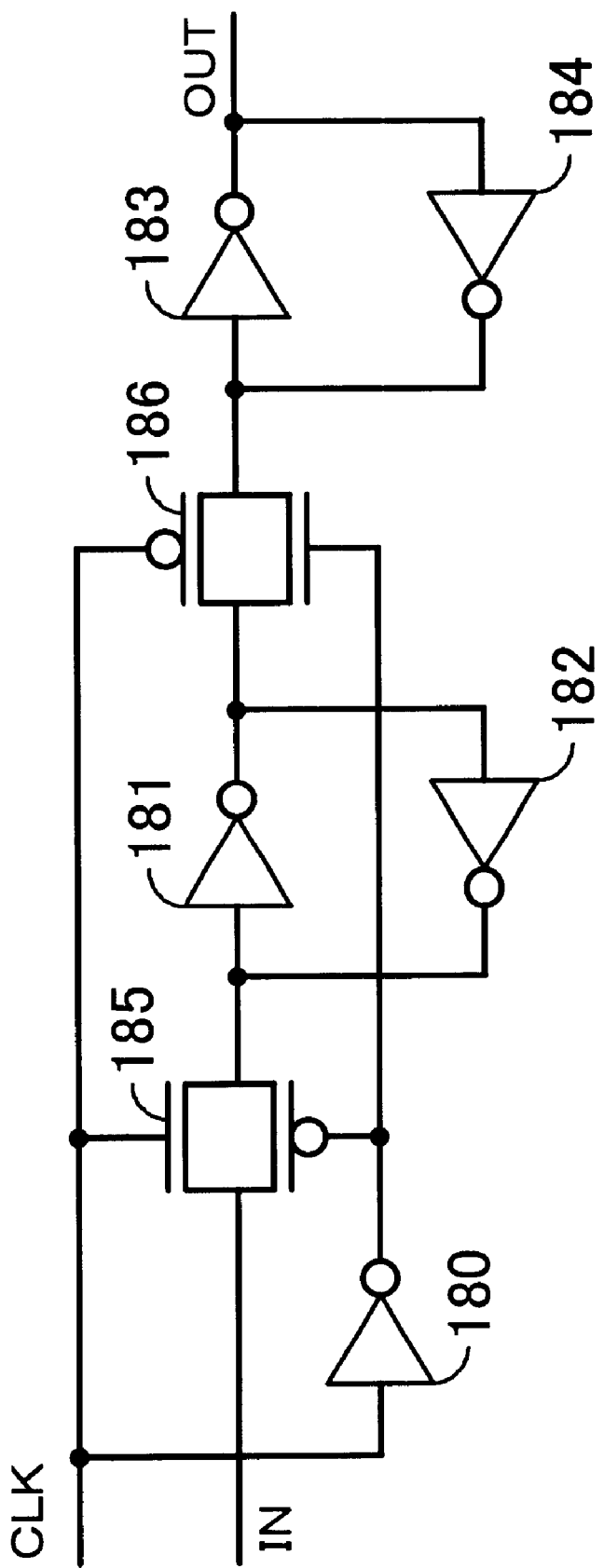
FIG. 10 is a view showing the detailed structure of the DFFs shown in FIG. 9.

FIG. 10 is a view showing the structure of the DFFs 150 through 156. As shown in FIG. 10, the DFFs 150 through 156 comprise inverters 180 through 184 and complementary metal-oxide semiconductor (CMOS) switches 185 and 186.

As shown in FIG. 10, the inverter 180 inverts a CLK signal and provides the result to the CMOS switches 185 and 186.

When the CLK signal changes into the "H" state, the CMOS switch 185 goes into the ON state and provides an input signal to the inverter 181.

When the CLK signal changes into the "L" state, the CMOS switch 186 goes into the ON state and provides output from the inverter 181 to the inverter 183.

The inverter 181 inverts output from the CMOS switch 185 and provides the result to the CMOS switch 186.

The inverter 182 inverts output from the inverter 181 and feeds the result back to the input of the inverter 181.

The inverter 183 inverts output from the CMOS switch 186 and outputs the result.

The inverter 184 inverts output from the inverter 183 and feeds the result back to the input of the inverter 183.

Back in FIG. 9, the NOR element 157 provides N7 that is obtained by inverting the logical sum of N2 (output from the DFF 151) and N8 (output from the NOR element 158) to the NOR element 162.

The NOR element 158 provides the result that is obtained by inverting the logical sum of N7 (output from the NOR element 157) and N6 (output from the DFF 155) to the NOR element 157 as N8.

The NOR element 159 outputs the result that is obtained by inverting the logical sum of N3 (output from the DFF 152) and N10 (output from the NOR element 160) as N9.

The NOR element 160 provides the result that is obtained by inverting the logical sum of N9 (output from the NOR element 159) and N5 (output from the DFF 154) to the NOR element 159 as N10.

The NOR element 161 provides the result that is obtained by inverting the logical sum of N9 (output from the NOR element 159) and output from the inverter 164 to the NOR element 163 as N11.

The NOR element 162 provides the result that is obtained by inverting the logical sum of N7 (output from the NOR element 157) and output from the inverter 165 to the NOR element 163 as N12.

The NOR element 163 outputs the result that is obtained by inverting the logical sum of N11 (output from the NOR element 161) and N12 (output from the NOR element 162).

The inverter 166 provides the result that is obtained by inverting output from the NOR element 163 to the DS input circuit 131$j$ as a DSE signal.

Now, operation in the above embodiment will be described.

When the information processing unit shown in FIG. 6 is started, the control unit 120 provides a burst length setting command to the semiconductor memory device 130 to set a burst length.

If a burst length is set to "2," for example, the control unit 120 provides a burst length setting command to the CMD input terminal 131$b$ of the semiconductor memory device 130.

The CMD decoder 131$m$ obtains the burst length setting command via the CMD input circuit 131$g$ and detects that a request to set the burst length is made.

The control unit 120 then provides data which represents "2", being a value burst length will be set to, to the ADD input terminal 131$c$.

The burst length judging circuit 131$n$ inputs this data via the ADD input circuit 131$h$, judges that the burst length is "2," and informs the DS input activation judging circuit 131$i$ that BL=2. Furthermore, the CMD decoder 131$m$ sets the I/O circuit 136 so that the burst length will be "2."

Now setting a burst length has been completed.

Figure 11:
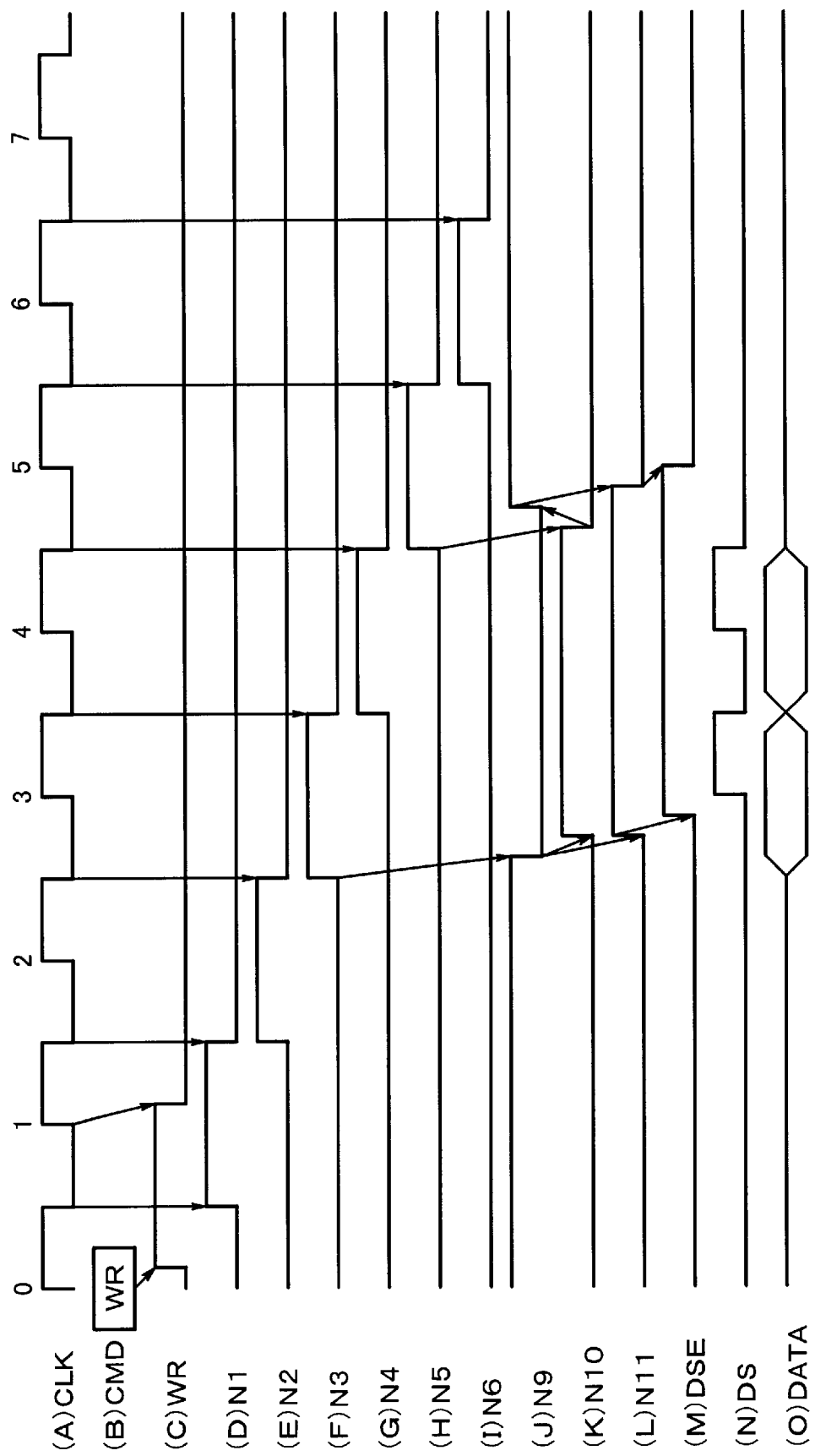
FIG. 11 is a timing chart for describing operation in the embodiment shown in FIG. 6 in the case of burst length being "2."

Operation for writing data in the case of burst length having been set to "2" in the above way will now be described with reference to FIG. 11.

When the inputting of a CLK signal shown in FIG. 11(A) is begun and a WR command (see FIG. 11(B)) is input from the CMD input terminal 131$b$ at the zeroth leading edge shown in FIG. 11(A), the CMD input circuit 131$g$ provides this WR command to the CMD decoder 131$m$.

By decoding the command supplied from the CMD input circuit 131$g$, the CMD decoder 131$m$ detects that the WR command was provided, and provides a WR signal to the DS input activation judging circuit 131$i$ (see FIG. 11(C)).

When the WR signal is provided, each of the DFFs 150 through 156 in the DS input activation judging circuit 131$i$ latches the WR signal in synchronization with the trailing edge of the CLK signal and provides output in order to a circuit at the following stage. As a result, N1 through N6, being output from the DFFs 150 through 156 respectively, are WR signals each delayed in order by one clock cycle (see FIGS. 11(D) through 11(I)).

The burst length is set to "2," so a BL2 signal and BL4 signal shown in FIG. 9 are in the "H" and "L" states respectively. Therefore, output from the inverter 164 is "L" and output from the inverter 165 is "H." As a result, only output from the NOR element 161 will be provided to the NOR element 163. That is to say, if the burst length has been set to "2," the NOR elements 159, 160, and 161 are selected and a signal generated by them is output as a DSE signal.

To be concrete, N9 (output from the NOR element 159) goes into the "L" state when N3 (output from the DFF 152) changes into the "H" state (see FIG. 11(J)). As a result, N10 (output from the NOR element 160) and N11 (output from the NOR element 161) go into the "H" state (see FIGS. 11(K) and 11(L)).

When N11 (output from the NOR element 161) changes into the "H" state, output from the NOR element 163 goes into the "L" state. As a result, a DSE signal, being output from the inverter 166, goes into the "H" state (see FIG. 11(M)).

As shown in FIG. 11(N), when the DSE signal changes into the "H" state, the DS input circuit 131$j$ inputs a DS signal from the DS input terminal 131$d$ and provides it to the DATA input circuit 131$k$.

As shown in FIG. 11(O), the DATA input circuit 131$k$ inputs data from the DATA input-output terminal 131$e$ and provides it to the I/O circuit 136. The data provided to the I/O circuit 136 will be written to the cell 132 next time a WR signal is provided.

When N5 (output from the DFF 154) changes into the "H" state (see FIG. 11(H)), N10 (output from the NOR element 160) goes into the "L" state (see FIG. 11(K)). When N10 goes into the "L" state, N9 (output from the NOR element 159) changes into the "H" state (see FIG. 11(J)).

When N9 changes into the "H" state, N11 (output from the NOR element 161) goes into the "L" state (see FIG. 11(L)). As a result, the DSE signal changes into the "L" state (see FIG. 11(M)).

When the DSE signal changes into the "L" state, the inputting of the DS signal from the DS input circuit 131$j$ is completed.

As a result, in the case of burst length having been set to "2," write latency will be set to "3" and transfer operation will be performed.

Figure 12:
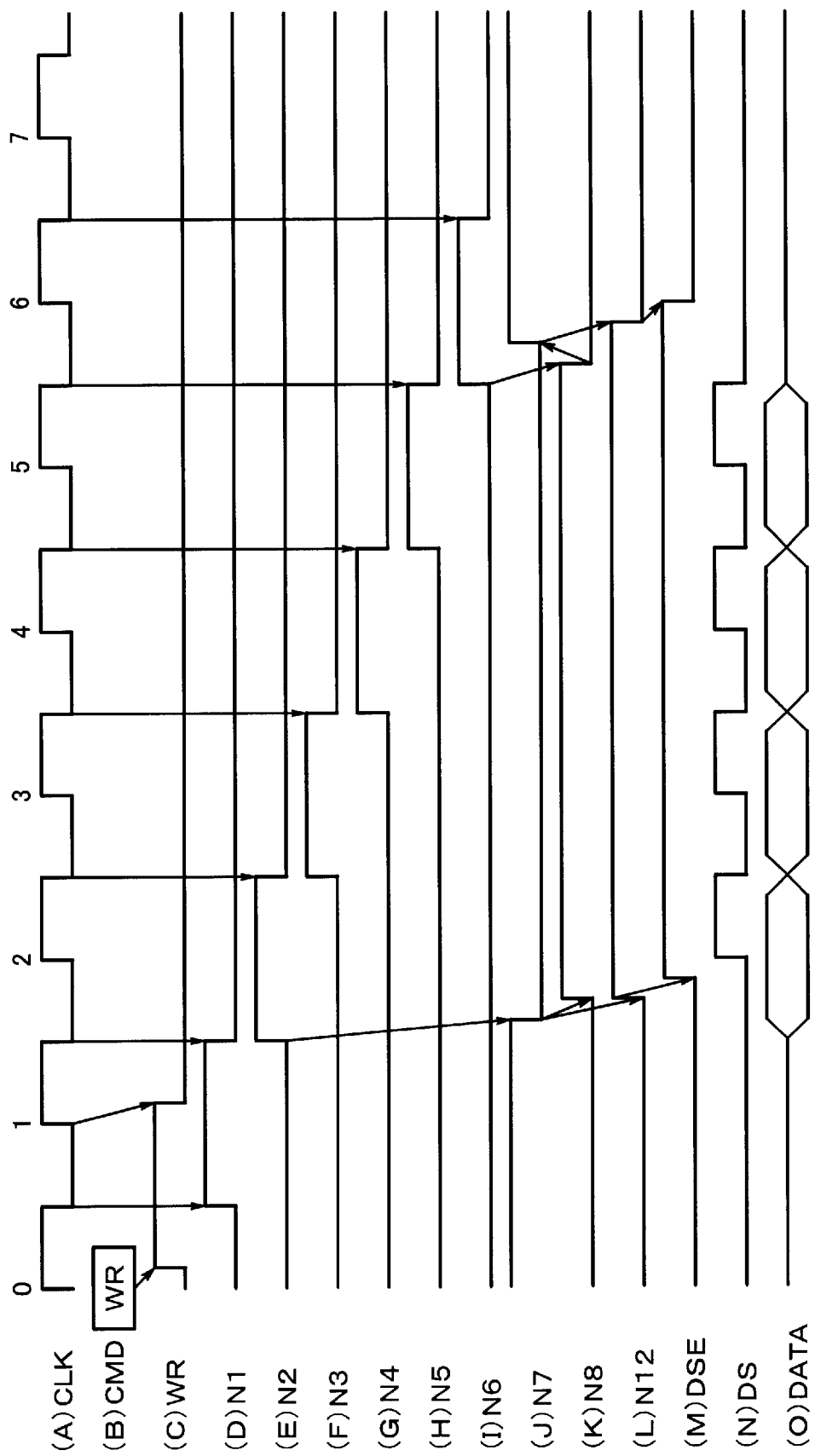
FIG. 12 is a timing chart for describing operation in the embodiment shown in FIG. 6 in the case of burst length being "4."

With reference to FIG. 12, a case where a burst length has been set to "4" will now be described.

When the information processing unit shown in FIG. 6 is started, the control unit 120 provides a command to set a burst length to "4" to the CMD input terminal 131b of the semiconductor memory device 130.

The CMD decoder 131m obtains the burst length setting command via the CMD input circuit 131g and detects that a request to set a burst length is made.

The control unit 120 then provides data which represents "4," being a value burst length is to be set to, to the ADD input terminal 131c.

The burst length judging circuit 131n inputs this data via the ADD input circuit 131h, judges that the burst length is "4," and informs the DS input activation judging circuit 131i that BL=4. Furthermore, the CMD decoder 131m sets the I/O circuit 136 so that the burst length will be "4."

Now the setting of a burst length has been completed.

With reference to FIG. 12, operation for writing data in the case of burst length being "4" will now be described.

When the inputting of a CLK signal shown in FIG. 12(A) is begun and a WR command (see FIG. 12(B)) is input from the CMD input terminal 131b at the zeroth leading edge shown in FIG. 12(A), the CMD input circuit 131g provides this WR command to the CMD decoder 131m.

By decoding the command supplied from the CMD input circuit 131g, the CMD decoder 131m detects that the WR command was provided, and provides a WR signal to the DS input activation judging circuit 131i (see FIG. 12(C)).

When the WR signal is provided, each of the DFFs 150 through 156 in the DS input activation judging circuit 131i latches the WR signal in synchronization with the trailing edge of the CLK signal and provides output in order to a circuit at the following stage. As a result, N1 through N6, being output from the DFFs 150 through 156 respectively, are WR signals each delayed in order by one clock cycle (see FIGS. 12(D) through 11(I)).

The burst length is set to "4," so a BL2 signal and BL4 signal shown in FIG. 9 are in the "L" and "H" states respectively. Therefore, output from the inverter 164 is "H" and output from the inverter 165 is "L." As a result, only output from the NOR element 162 will be provided to the NOR element 163. That is to say, if the burst length has been set to "4," the NOR elements 157, 158, and 162 are selected and a signal generated by them is output as a DSE signal.

To be concrete, N7 (output from the NOR element 157) goes into the "L" state when N2 (output from the DFF 151) changes into the "H" state (see FIG. 12(J)). As a result, N8 (output from the NOR element 158) and N12 (output from the NOR element 162) go into the "H" state (see FIGS. 12(K) and 12(L)).

When N12 (output from the NOR element 162) changes into the "H" state, output from the NOR element 163 goes into the "L" state. As a result, a DSE signal, being output from the inverter 166, goes into the "H" state (see FIG. 12(M)).

As shown in FIG. 12(N), when the DSE signal changes into the "H" state, the DS input circuit 131j inputs a DS signal from the DS input terminal 131d and provides it to the DATA input circuit 131k.

As shown in FIG. 12(O), the DATA input circuit 131k inputs four bits of data from the DATA input-output terminal 131e and provides them to the I/O circuit 136. The four bits of data provided to the I/O circuit 136 will be written to the cell 132 next time a WR signal is provided.

When N6 (output from the DFF 155) changes into the "H" state (see FIG. 12(H)), N8 (output from the NOR element 158) goes into the "L" state (see FIG. 12(K)). When N8 goes into the "L" state, N7 (output from the NOR element 157) changes into the "H" state (see FIG. 12(J)).

When N7 changes into the "H" state, N12 (output from the NOR element 162) goes into the "L" state (see FIG. 12(L)). As a result, the DSE signal changes into the "L" state (see FIG. 12(M)).

When the DSE signal changes into the "L" state, the inputting of the DS signal from the DS input circuit 131j is completed.

As a result, in the case of burst length having been set to "4," write latency will be set to "2" and transfer operation will be performed.

Figure 13:
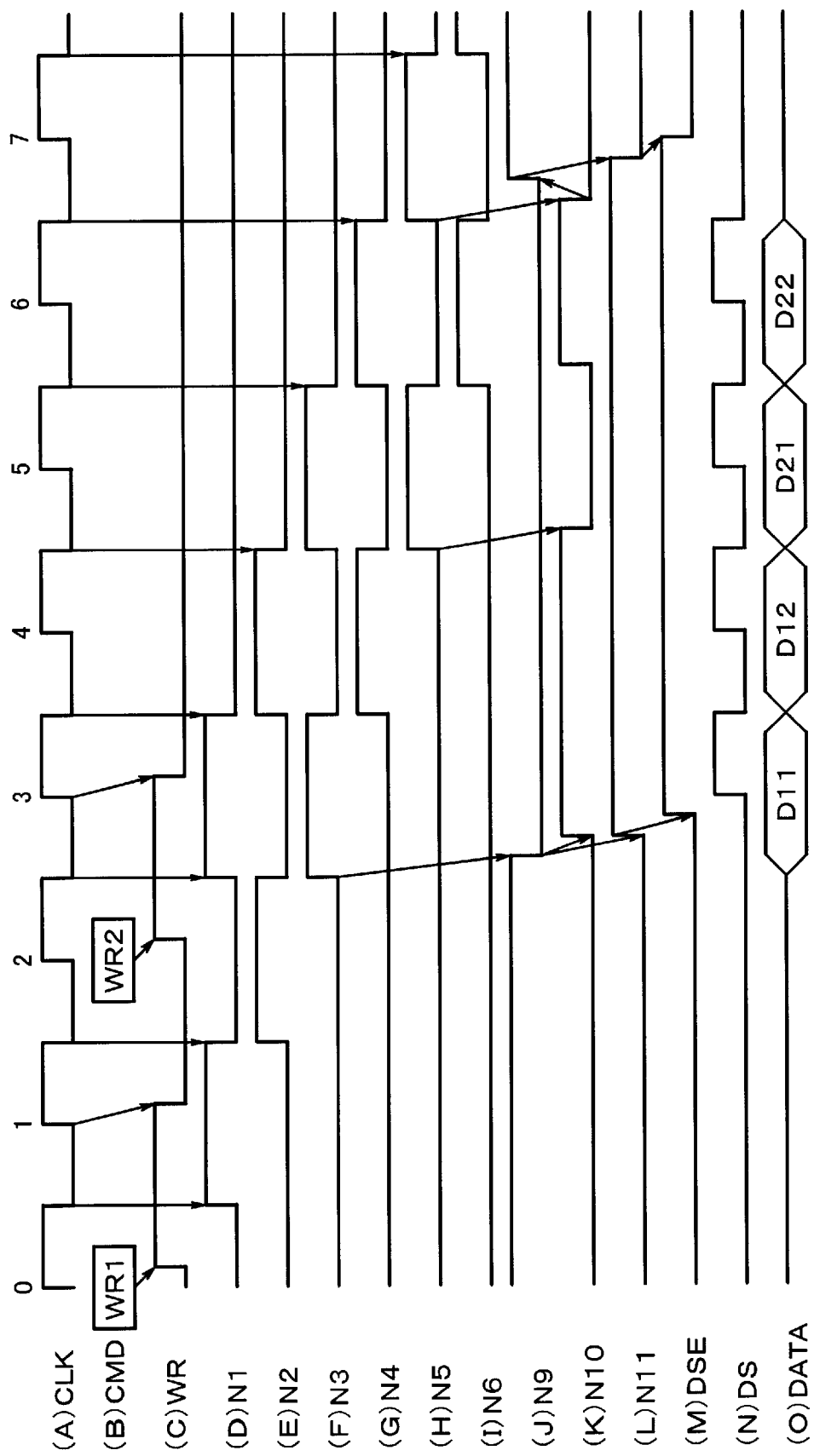
FIG. 13 is a timing chart for describing operation in the embodiment shown in FIG. 6 in the case of burst length being "2" and WR commands being input consecutively.

With reference to FIG. 13, operation in the case of burst length being "2" and WR commands being input consecutively will now be described.

When a first WR command is input, the same operation that was described above is performed and D11 and D12 are transferred.

After they are transferred, N5 (output from the DFF 154) goes into the "L" state. N3 (output from the DFF 152) goes into the "H" state almost concurrently with it, so a DSE signal holds the "H" state. As a result, D21 and D22 will be input consecutively without the DSE signal being reset.

Therefore, if WR commands are input consecutively, bits of data will be input consecutively.

Figure 14:
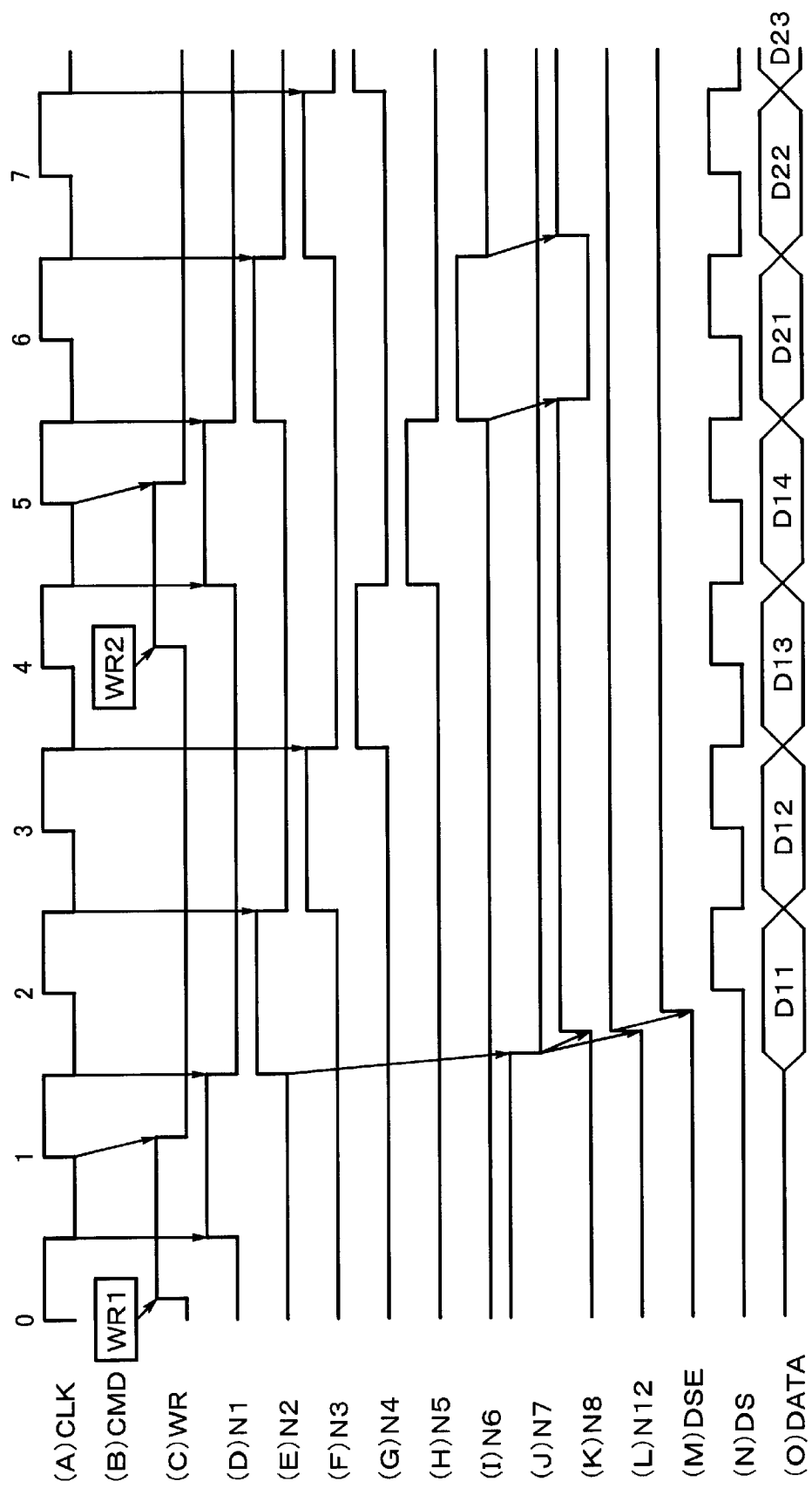
FIG. 14 is a timing chart for describing operation in the embodiment shown in FIG. 6 in the case of burst length being "4" and WR commands being input consecutively.

With reference to FIG. 14, operation in the case of burst length being "4" and WR commands being input consecutively will now be described.

When a first WR command is input, the same operation that was described above is performed and D11 through D14 are transferred.

After they are transferred, N6 (output from the DFF 155) goes into the "L" state. N2 (output from the DFF 151) goes into the "H" state almost concurrently with it, so a DSE signal holds the "H" state. As a result, D21 through D24 will be input consecutively without the DSE signal being reset.

As described above, in the embodiment of the present invention, write latency is set according to a burst length. Therefore, data can be transferred efficiently by setting optimum latency according to a burst length.

In the above embodiment, cases where burst lengths are "2" and "4" have been described. However, the present invention is also applicable to other cases, of course.

Moreover, in the above embodiment, write latency is set according to a burst length. However, write latency may be calculated by, for example, adding a constant value being independent of a burst length and a value determined according to a burst length. That is to say, write latency depends not only on a burst length but also on access time for reading. Therefore, write latency may be calculated by considering this access time to be constant and by adding time which varies according to a burst length to this constant time. This will enable to calculate write latency easily.

Furthermore, in the above embodiment, write latency according to a burst length is generated by the circuits shown in FIG. 9. This method is, however, a simple example. The present invention is not limited only to such a case, of course. For example, preparing a conversion table which associates a burst length with write latency and selecting write latency according to a burst length with this conversion table is possible as another embodiment.

(Second Embodiment)

Figure 15:
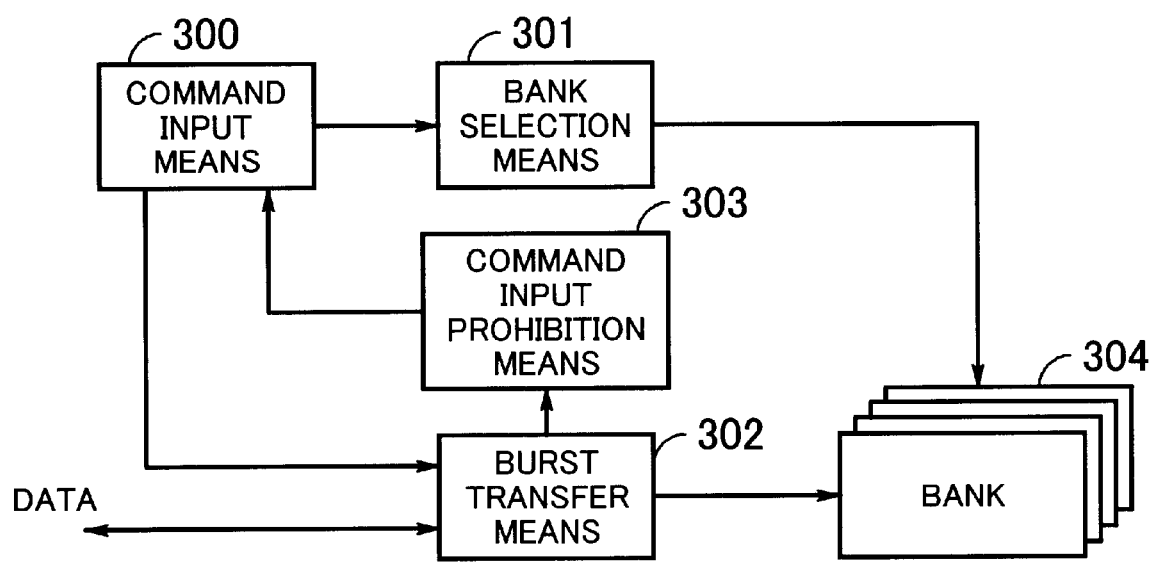
FIG. 15 is a view for describing the operative principles of the present invention.

FIG. 15 is a view for describing the operative principles of the present invention. In FIG. 15, command input means 300 receives a command input from the outside.

Bank selection means 301 selects a predetermined bank corresponding to the command from among a bank group 304.

Burst transfer means 302 performs a burst transfer with the bank selected by the bank selection means 301 as a target.

When the burst transfer means 302 begins a burst transfer, command input prohibition means 303 prohibits the command input means 300 from receiving a new command input.

The bank group 304 is a set of banks including a cell where a plurality of storage elements are arranged like a matrix, a row decoder, a column decoder, and a sense amplifier. A burst transfer is performed with the bank selected by the bank selection means 301 as a target.

Now, operation in FIG. 15 will be described.

It is assumed that an RD command, for example, is input from the command input means 300 and that a request to perform a burst transfer with a predetermined bank as a target is made. Then the bank selection means 301 selects the appropriate bank from among the bank group 304.

The burst transfer means 302 performs a burst transfer with the bank selected by the bank selection means 301 as a target. That is to say, the burst transfer means 302 reads a plurality of bits of data in block from the predetermined bank and outputs them to the outside.

When the burst transfer means 302 begins a burst transfer, command input prohibition means 303 prohibits the command input means 300 from inputting a command. As a result, the command input means 300 does not input a new command before the burst transfer is completed. This enables to save the process of decoding a command. As a result, a margin for operation can be ensured and stable operation can be realized even at the time of high-speed operation.

As described above, with a semiconductor memory device according to the present invention, inputting a command is prohibited during a burst transfer. This enables to save the process of decoding a command. Therefore, a margin for operation can be ensured and stable operation can be expected even at the time of high-speed operation.

An embodiment of the present invention will now be described.

Figure 16:
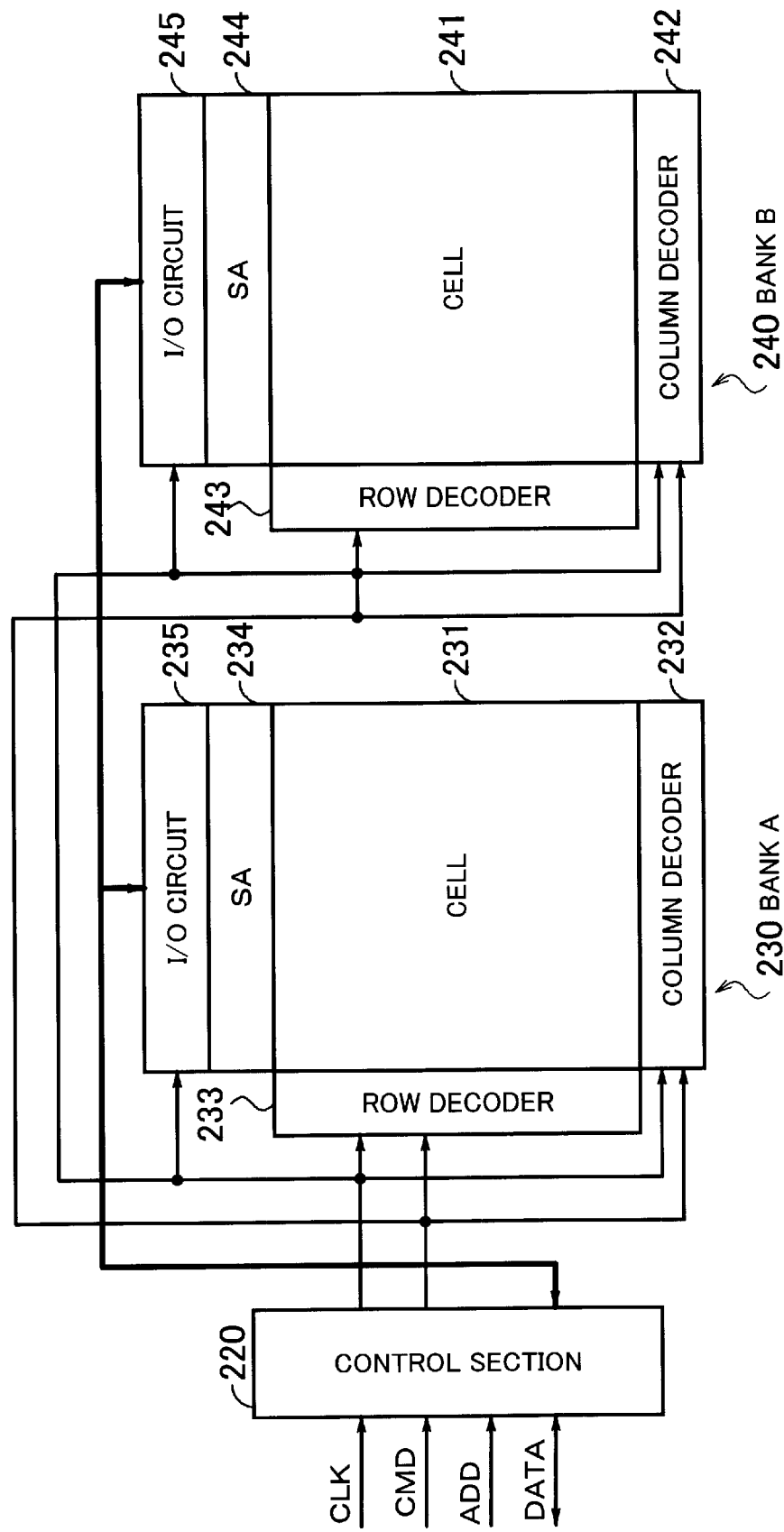
FIG. 16 is a view showing the structure of an embodiment of the present invention.

FIG. 16 is a view showing the structure of an embodiment of the present invention. As shown in FIG. 16, a semiconductor memory device according to the present invention comprises a control section 220, bankA 230, and bankB 240. The bankA 230 includes a cell 231, a column decoder 232, a row decoder 233, a sense amplifier (SA) 234, and an input-output (I/O) circuit 235. Similarly, the bankB 240 includes a cell 241, a column decoder 242, a row decoder 243, an SA 244, and an I/O circuit 245.

The control section 220 inputs a CLK signal, CMD signal, ADD signal, DATA signal, etc. and provides them to each section of the device. Moreover, in the case of transferring data, the control section 220 selects a predetermined bank and reads data from or writes data to it.

The cell 231 in the bankA 230 includes a group of storage elements arranged like a matrix and stores data input.

The row decoder 233 specifies a predetermined row in the cell 231 on the basis of a row address in the case of inputting or outputting data.

The column decoder 232 specifies a predetermined column in the cell 231 on the basis of a column address in the case of inputting or outputting data.

The SA 234 amplifies a signal read from the cell 231 by a predetermined gain and converts it to a digital one.

The I/O circuit 235 controls operation regarding inputting and outputting data.

The structure of the bankB 240 is the same as that of the bankA 230, so descriptions of the bankB 240 will be omitted.

Figure 17:
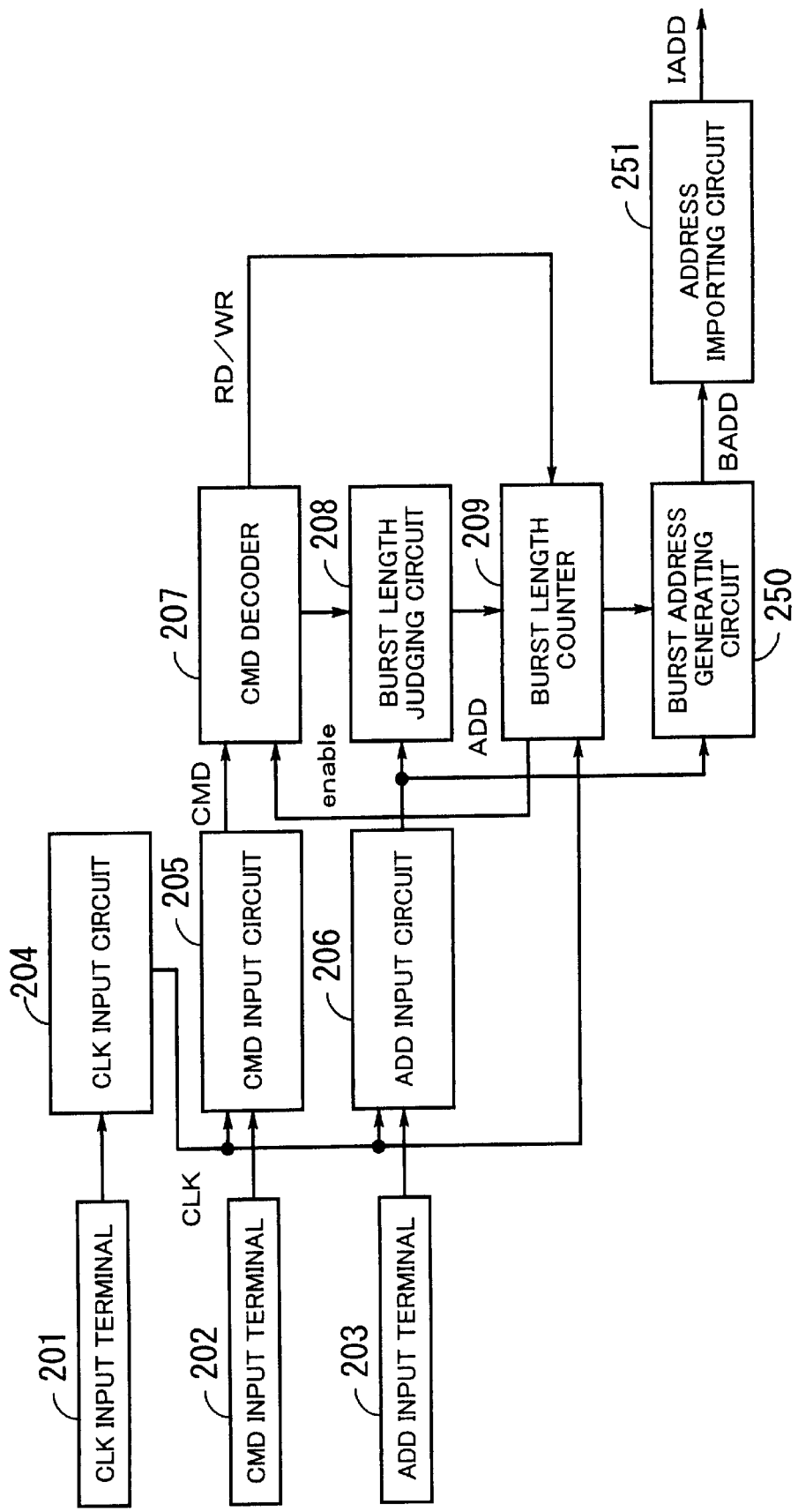
FIG. 17 is a view showing the structure of the control section shown in FIG. 16.

FIG. 17 is a view showing the detailed structure of the control section 220 shown in FIG. 16.

A CLK input terminal 201 receives a CLK signal input from the outside. A CMD input terminal 202 receives a CMD signal input from the outside. An ADD input terminal 203 receives an ADD signal input from the outside.

A CLK input circuit 204 performs waveform shaping on the CLK signal input from the CLK input terminal 201 and provides it to a CMD input circuit 205, ADD input circuit 206, and burst length counter 209.

The CMD input circuit 205 performs waveform shaping on the CMD signal input from the CMD input terminal 202 and provides it to a CMD decoder 207.

The ADD input circuit 206 performs waveform shaping on the ADD signal input from the ADD input terminal 203 and provides it to a burst length judging circuit 208.

If an enable signal supplied from the burst length counter 209 is in the "H" state, the CMD decoder 207 obtains the CMD signal from the CMD input circuit 205, decodes it, extracts an RD command and WR command, and provides them to the burst length counter 209. If an enable signal supplied from the burst length counter 209 is not in the "H" state, the CMD decoder 207 does not obtain the CMD signal.

If a command to set a burst length is input at the time of, for example, starting the device, the burst length judging circuit 208 analyzes the command and judges the burst length set.

If an RD command or WR command is input and a burst transfer is begun, the burst length counter 209 makes a request to reset a burst address, counts a burst length in synchronization with the CLK signal, and requests a burst address generating circuit 250 to count up a burst address. Furthermore, when a burst transfer is begun, the burst length counter 209 changes an enable signal into the "L" state and prohibits obtaining a new command.

An address importing circuit 251 performs waveform shaping on a burst address BADD supplied from burst address generating circuit 250 and outputs it as an internal address IADD.

Figure 18:
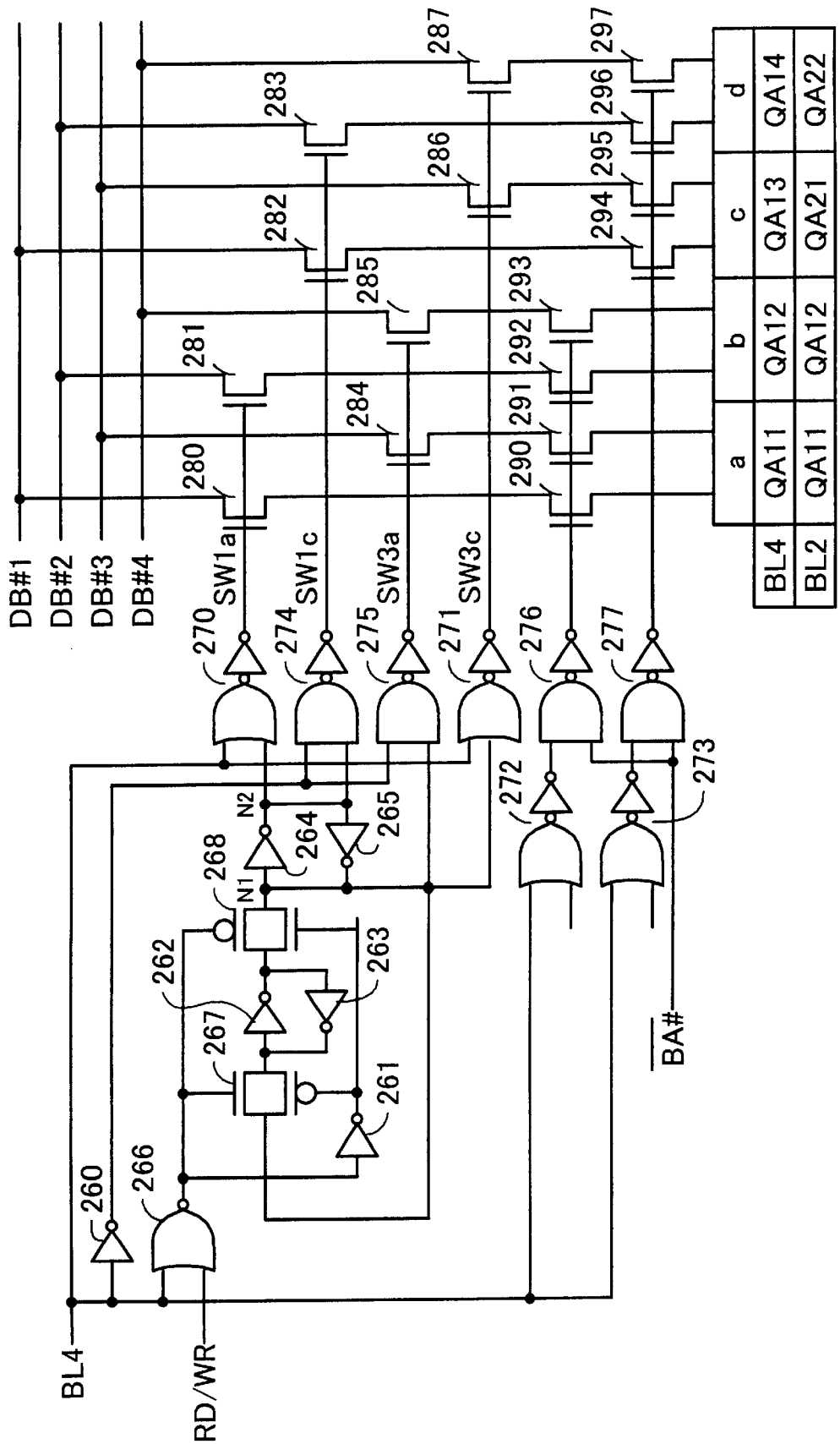
FIG. 18 is a view showing the detailed structure of the I/O circuit 235 shown in FIG. 16.

FIG. 18 is a view showing the structure of the I/O circuit 235 shown in FIG. 16. As shown in FIG. 18, the I/O circuit 235 includes inverters 260 through 265, a NOR element 266, CMOS switches 267 and 268, OR elements 270 through 273 including a NOR element and inverter, AND elements 274 through 277 including a NAND element and inverter, and MOS switches 280 through 287 and 290 through 297.

The inverter 260 inverts a BL4 signal which will go into the "H" state in the case of burst length being "4," and provides the result to the AND elements 274 and 275.

The NOR element 266 inverts the logical sum of the BL4 signal and an RD/WR signal and provides the result to the inverter 261 and CMOS switches 267 and 268.

The inverter 261 inverts output from the NOR element 266 and provides the result to the CMOS switches 267 and 268.

If output from the NOR element 266 is "H," the CMOS switch 267 goes into the ON state.

The inverter 262 inverts output from the CMOS switch 267 and provides the result to the CMOS switch 268. The inverter 263 inverts output from the inverter 262 and feeds back the result to the input of the inverter 262.

If output from the NOR element 266 is "L," the CMOS switch 268 goes into the ON state.

The inverter 264 inverts output from the CMOS switch 268 and provides the result to the OR element 270 and AND element 274. The inverter 265 inverts output from the inverter 264 and feeds back the result to the input of the inverter 264.

The inverters 261 through 265 and CMOS switches 267 and 268 form a frequency division circuit and the frequency of the RD/WR signal input is demultiplied by two by this circuit. The demultiplied signal is output as an output signal N1. The inverter 264 inverts the demultiplied signal and output the result as an output signal N2.

The OR element 270 finds the logical sum of output from the inverter 264 and the BL4 signal and outputs it.

The OR element 271 finds the logical sum of the BL4 signal and output from the CMOS switch 268 and outputs it.

The OR element 272 finds the logical sum of an A# signal to select a high- or low-order bit and the BL4 signal and outputs the result.

The OR element 273 finds the logical sum of an NA# signal ("N" means an inverted signal) to select a high- or low-order bit and the BL4 signal and outputs the result.

The AND element 274 finds the logical product of output from the inverter 260 and output from the inverter 264 and outputs it.

The AND element 275 finds the logical product of output from the CMOS switch 268 and output from the inverter 260 and outputs it.

The AND element 276 finds the logical product of output from the OR element 272 and an NBA# signal to select a bank and outputs it.

The AND element 277 finds the logical product of output from the OR element 273 and the NBA# signal to select a bank and outputs it.

When an SW1a signal, being output from the OR element 270, changes into the "H" state, the MOS switches 280 and 281 go into the ON state and connect DB#1 and DB#2 with output a and b, respectively, of the sense amplifier 234.

When an SW1c signal, being output from the AND element 274, changes into the "H" state, the MOS switches 282 and 283 go into the ON state and connect the DB#1 and DB#2 with output c and d, respectively, of the sense amplifier 234.

When an SW3a signal, being output from the AND element 275, changes into the "H" state, the MOS switches 284 and 285 go into the ON state and connect DB#3 and DB#4 with the output a and b, respectively, of the sense amplifier 234.

When an SW3c signal, being output from the OR element 271, changes into the "H" state, the MOS switches 286 and 287 go into the ON state and connect the DB#3 and DB#4 with the output c and d, respectively, of the sense amplifier 234.

When output from the AND element 276 changes into the "H" state, the MOS switches 290 through 293 go into the ON state. As a result, the MOS switch 290 connects the MOS switch 280 with the output a of the sense amplifier 234, the MOS switch 291 connects the MOS switch 284 with the output a of the sense amplifier 234, the MOS switch 292 connects the MOS switch 281 with the output b of the sense amplifier 234, and the MOS switch 293 connects the MOS switch 285 with the output b of the sense amplifier 234.

When output from the AND element 277 changes into the "H" state, the MOS switches 294 through 297 go into the ON state. As a result, the MOS switch 294 connects the MOS switch 282 with the output c of the sense amplifier 234, the MOS switch 295 connects the MOS switch 286 with the output c of the sense amplifier 234, the MOS switch 296 connects the MOS switch 283 with the output d of the sense amplifier 234, and the MOS switch 297 connects the MOS switch 287 with the output d of the sense amplifier 234.

Figure 19:
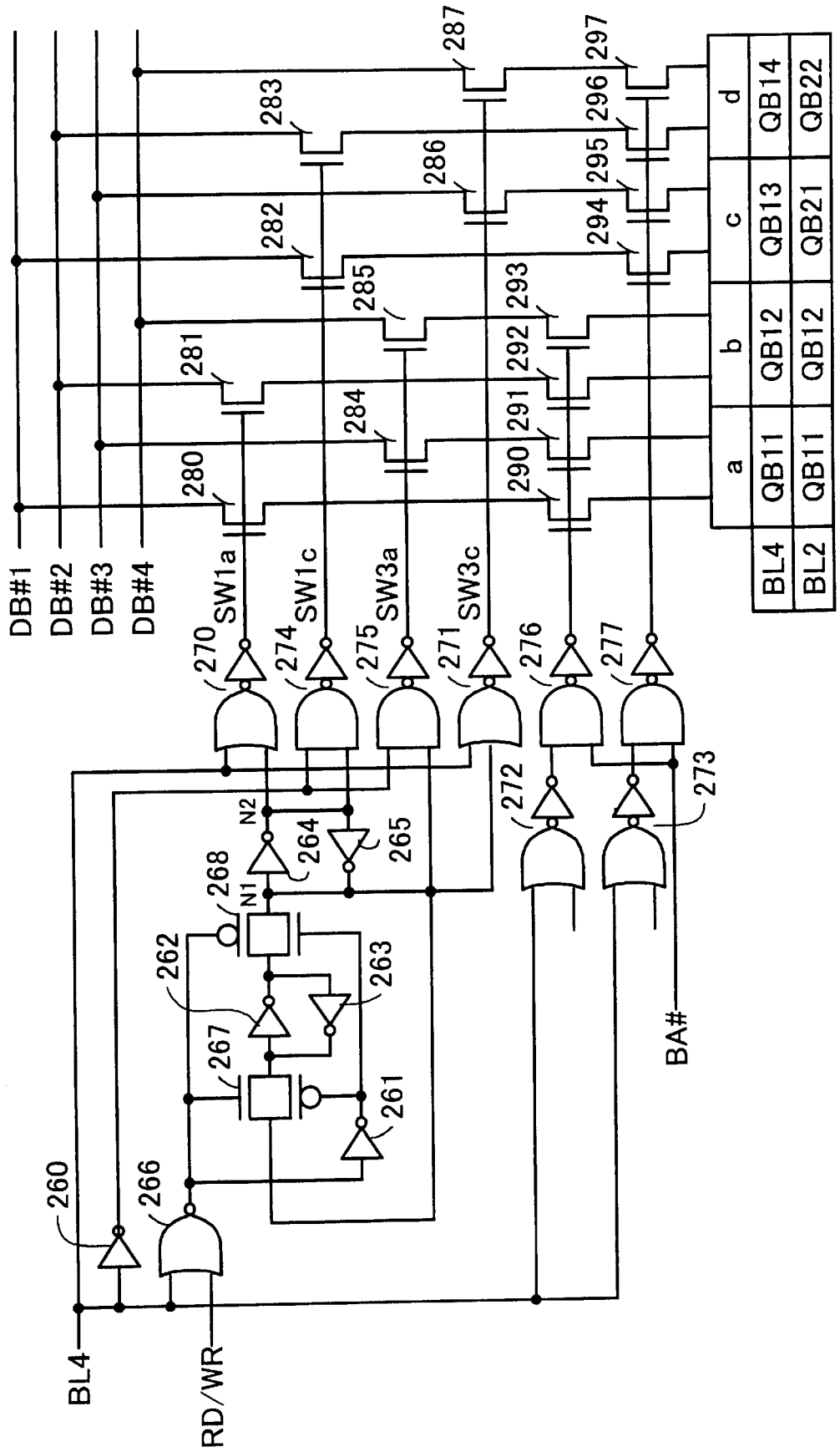
FIG. 19 is a view showing the detailed structure of the I/O circuit 245 shown in FIG. 16.

FIG. 19 is a view showing the detailed structure of the I/O circuit 245 shown in FIG. 16. Portions in FIG. 19 corresponding to those in FIG. 18 are marked with the same symbols and descriptions of them will be omitted.

Compared with the I/O circuit 235, an NBA# signal input to the AND elements 276 and 277 is changed to a BA# signal.

In addition, QA, being output from the sense amplifier, stated in the lower right portion of FIG. 18 is changed to QB. Particularly, QA 11, QA12, QA 13, QAl4, QA21 and QA22 of FIG. 18, which also represent states of internal data bus #1 and internal data bus #2, are now shown as QB 11, QB12, QB 13, QBI4, QB21 and QB22 in FIG. 19 that also represent states of internal data bus #3 and internal data bus #4 (see also FIG. 20).

Except for these things, the structure of the I/O circuit 245 is the same as that of the I/O circuit 235 shown in FIG. 18.

Operation in the above embodiment will now be described.

When the semiconductor memory device is started and a mode register set command to set a burst length is input from the CMD input terminal 202, the CMD decoder 207 detects that a request to set a burst length was made and informs the burst length judging circuit 208 of it.

The burst length judging circuit 208 obtains data for setting a burst length input from the ADD input terminal 203 and judges the burst length. For example, if "2" is input as a burst length, the burst length judging circuit 208 recognizes it and informs the burst length counter 209 of it.

As a result, a burst length will be set.

Now, detailed operation in the case of burst length having been set to "2" in the above way will be described.

When an RDB command to request the reading of data from the bankB 240, shown in FIG. 20(B), is provided to the CMD input terminal 202 at the leading edge of the zeroth clock (CLK) shown in FIG. 20(A), the CMD decoder 207 imports this RDB command (CMD) via the CMD input circuit 205 and decodes it. As a result, the CMD decoder 207 recognizes that a request to read data from the bankB 240 was made, and informs the burst length counter 209 of it.

The burst length counter 209 provides a RESET signal to the burst address generating circuit 250. As a result, the burst address generating circuit 250 obtains a leading address for a burst transfer supplied from the ADD input circuit 206 and outputs it as a BADD. Furthermore, the burst address generating circuit 250 counts up an address which it previously imported in synchronization with an UP signal supplied from the burst length counter 209 in synchronization with the CLK signal, and outputs it as a BADD for the second bit and the following lower-order bits.

The address importing circuit 251 performs waveform shaping on the BADD supplied from burst address generating circuit 250 and outputs it as an internal address IADD.

The internal address IADD output from the address importing circuit 251 will be used in the control section 220 for selecting the DB#1 (INTERNAL DATA BUS #1) through DB#4 (INTERNAL DATA BUS #4).

During a burst transfer, the burst length counter 209 keeps an enable signal it provides to the CMD decoder 207 in the "L" state. When an enable signal is in the "L" state, the CMD decoder 207 reserves obtaining a new command from the CMD input circuit 205. Therefore, if a burst transfer is begun, inputting a new command will be prohibited.

The operation in this example corresponds to a case where an RDB command is input, and the bankB 240 is specified as a bank from which data is read. Therefore, a BA# signal is in the "H" state (see FIG. 22(H)) and an NBA# signal is in the "L" state (see FIG. 21(H)). As a result, output from the AND elements 276 and 277 in the bankA 230 shown in FIG.

18 goes into the "L" state, all of the MOS switches 290 through 297 go into the OFF state, and output to the DB#1 through DB#4 is shut down.

On the other hand, in the I/O circuit 245 of the bankB 240 shown in FIG. 19, a BL4 signal is "L," so output from the OR elements 272 and 273 goes into the "H" or "L" state according to an A# signal and NA# signal. To be concrete, when the A# signal is "H", output from the OR element 272 is "H" and output from the OR element 273 is "L." When the A# signal is "L", output from the OR element 272 is "L" and output from the OR element 273 is "H."

As stated above, if the bankB 240 is selected, the BA# signal is in the "H" state. Therefore, an AA# signal (see FIG. 22(I)), being output from the AND element 276 shown in FIG. 19, and NAA# signal (see FIG. 22(J)), being output from the AND element 277 shown in FIG. 19, go into the "H" or "L" state according to output from the OR elements 272 and 273.

Figure 22:
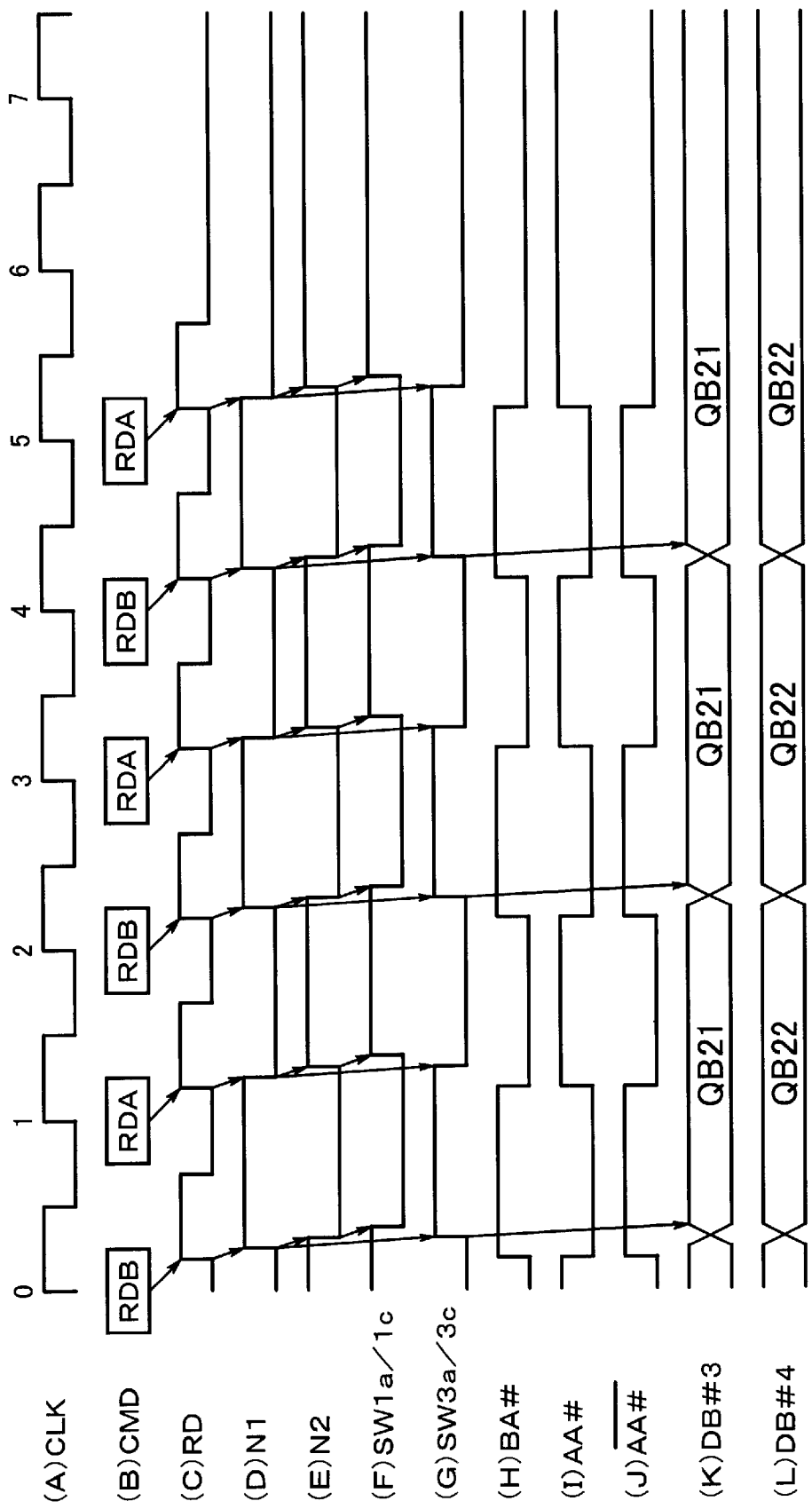
FIG. 22 is a timing chart for describing the operation of the circuit shown in FIG. 19.

In this example, as shown in FIG. 22(J), the NAA# signal goes into the "H" state in synchronization with the BA# signal. Therefore, when the NAA# signal goes into the "H" state, the MOS switches 294 through 297 change into the ON state.

As shown in FIG. 22(G), the SW3a signal and SW3c signal shown in FIG. 19 are generated from an N1 signal (see FIG. 22(D)) and go into the "H" state in synchronization with the NAA# signal. Therefore, output c and d of the sense amplifier 244 will be connected to the DB#3 and DB#4 respectively. As a result, QB21 and QB22 will be sent to the DB#3 and DB#4 respectively (see FIGS. 22(K) and 22(L)).

Next, when an RDA command to request the reading of data from the bankA 230, shown in FIG. 20(B), is provided to the CMD input terminal 202 at the leading edge of the first clock shown in FIG. 20(A), the CMD decoder 207 imports this RDA command via the CMD input circuit 205 and decodes it. As a result, the CMD decoder 207 recognizes that a request to read data from the bankA 230 was made, and informs the burst length counter 209 of it.

The burst length counter 209 provides a RESET signal to the burst address generating circuit 250. As a result, the burst address generating circuit 250 obtains a leading address for a burst transfer supplied from the ADD input circuit 206 and outputs it as a BADD. Furthermore, the burst address generating circuit 250 counts up an address which it previously imported in synchronization with an UP signal supplied from the burst length counter 209 in synchronization with the CLK signal, and outputs it as a BADD for the second and lower-order bits.

The address importing circuit 251 performs waveform shaping on the BADD supplied from the burst address generating circuit 250 and outputs it as an internal address IADD.

The internal address IADD output from the address importing circuit 251 will be used in the control section 220 for selecting the DB#1 through DB#4.

During a burst transfer, the burst length counter 209 keeps an enable signal it provides to the CMD decoder 207 in the "L" state. This is the same with the above case. When an enable signal is in the "L" state, the CMD decoder 207 reserves obtaining a new command from the CMD input circuit 205. Therefore, if a burst transfer is begun, inputting a new command will be prohibited.

The operation in this example corresponds to a case where an RDA command is input, and the bankA 230 is specified as a bank from which data is read. Therefore, an NBA# signal is in the "H" state (see FIG. 21(H)) and a BA# signal is in the "L" state (see FIG. 22(H)). As a result, output from the AND elements 276 and 277 in the bankB 240 shown in FIG. 18 goes into the "L" state, all of the MOS switches 290 through 297 go into the OFF state, and output to the DB#1 through DB#4 is shut down.

On the other hand, in the I/O circuit 235 of the banka 230 shown in FIG. 19, a BL4 signal is "L," so output from the OR elements 272 and 273 goes into the "H" or "L" state according to an A# signal and NA# signal. To be concrete, when the A# signal is "H", output from the OR element 272 is "H" and output from the OR element 273 is "L." When the A# signal is "L", output from the OR element 272 is "L" and output from the OR element 273 is "H."

As stated above, if the bankA 230 is selected, the NBA# signal is in the "H" state. Therefore, an AA# signal (see FIG. 21(I)), being output from the AND element 276, and NAA# signal (see FIG. 21(J)), being output from the AND element 277, go into the "H" or "L" state according to output from the OR elements 272 and 273.

Figure 21:
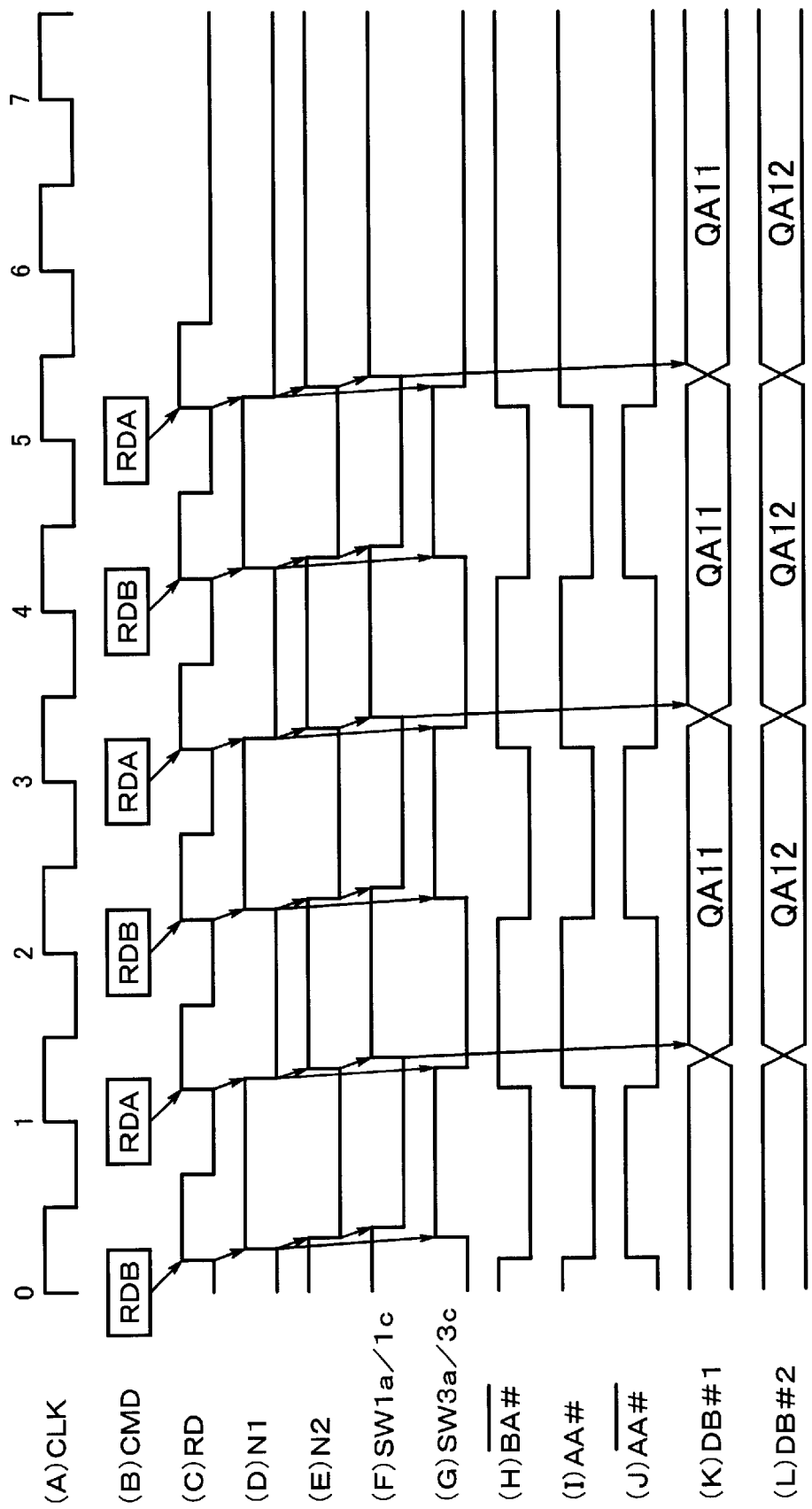
FIG. 21 is a timing chart for describing the operation of the circuit shown in FIG. 18.

In this example, as shown in FIG. 21(J), the AA# signal goes into the "H" state in synchronization with the NBA# signal. Therefore, when the AA# signal goes into the "H" state, the MOS switches 294 through 297 change into the ON state.

As shown in FIG. 21(F), the SW1a signal and SW1c signal are generated from an N2 signal (see FIG. 21(E)) and go into the "H" state in synchronization with the AA# signal. Therefore, output a and b of the sense amplifier 234 will be connected to the DB#1 and DB#2 respectively. As a result, QA11 and QA12 will be sent to the DB#1 and DB#2 respectively (see FIGS. 21(K) and 22(L)).

Figure 20:
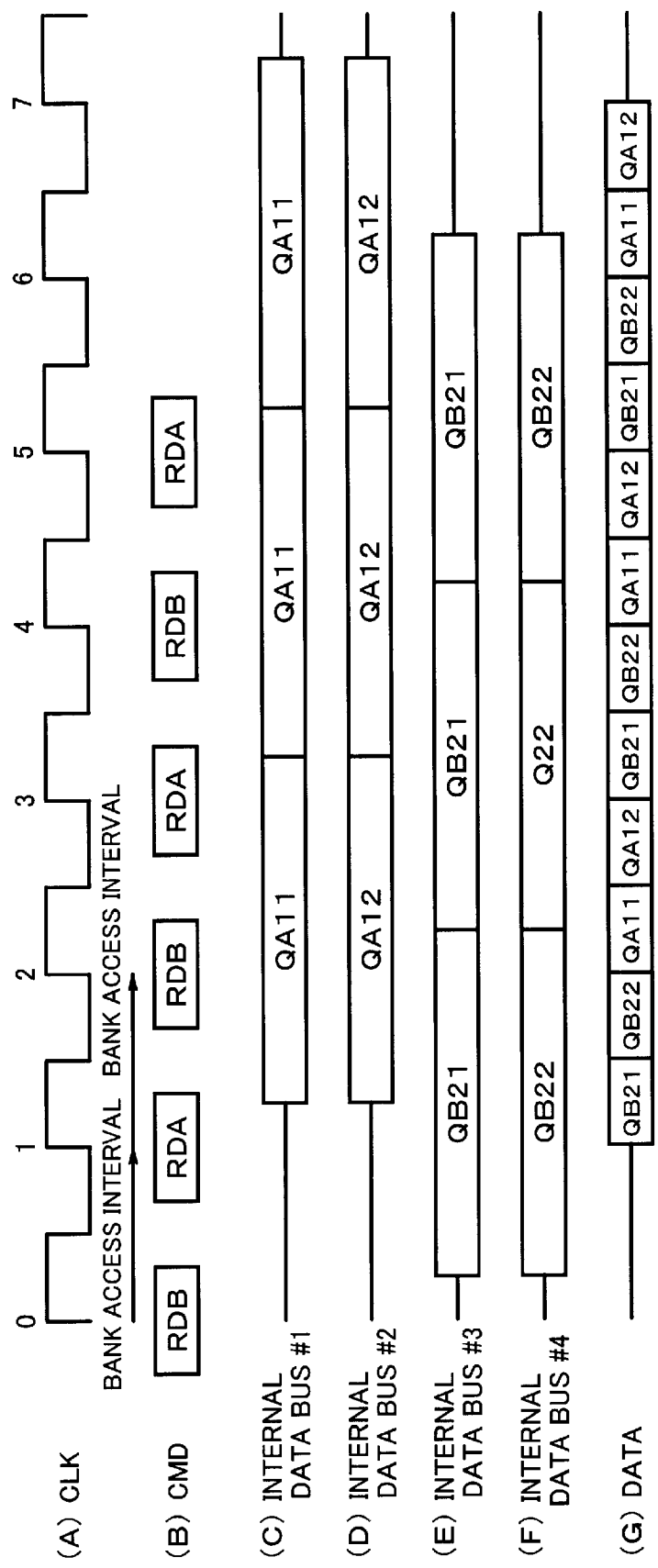
FIG. 20 is a timing chart showing an example of operation in the embodiment shown in FIG. 16.

In short, as shown in FIG. 20, if an RDB or RDA command is input at the leading edge of the CLK signal (see FIG. 20(A)), a burst address corresponding to the command is generated by the burst address generating circuit 250 and is provided to the bankA 230 and bankB 240. At this time, the BA# signal and NBA# signal show each bank which of the banks is selected. Predetermined output is selected by the MOS switches 280 through 287 and 290 through 297 and, as shown in FIGS. 20(C) through 20(F), data is output to the DB#1 through DB#4.

In this case, there is a shift corresponding to one clock between data output to the DB#1 and DB#2 and data output to the DB#3 and DB#4. Furthermore, the output cycle is equal to two clocks. Therefore, even if the operating frequency is increased, a margin for operation can be ensured.

Moreover, an enable signal from the burst length counter 209 prohibits the CMD decoder 207 from decoding a new command during a burst transfer. This saves the process necessary for decoding and a margin for operation at the time of high-speed operation can be ensured. In addition to this, there is no need of the CMD decoder 207 providing an NOP which indicates that a burst transfer is performing to the burst length counter 209.

Furthermore, if a burst length is set to a value smaller than the maximum burst length (in the above example, the maximum burst length is "4" and burst length is set to "2"), a data bus is divided and data is transferred by using the divided data buses alternately. As a result, time for transferring each bit of data can be prolonged and a margin at the time of high-speed operation can be ensured.

In the above embodiment, a case where the bankA 230 occupies the DB#1 and DB#2 and the bankB 240 occupies the DB#3 and DB#4 has been described as an example. However, there may be a case where the bankA 230 occupies the DB#3 and DB#4 and the bankB 240 occupies the DB#1 and DB#2, depending on the timing with which an RD command is input.

Now, operation performed in the case of burst length having been set to "4" will be described.

When the semiconductor memory device is started and a mode register set command to set a burst length is input from the CMD input terminal 202, the CMD decoder 207 detects that a request to set a burst length was made and informs the burst length judging circuit 208 of it.

The burst length judging circuit 208 obtains data input from the ADD input terminal 203 and judges the burst length. For example, if the burst length is set to "4," the burst length judging circuit 208 recognizes it and informs the burst length counter 209 of it.

Figure 23:
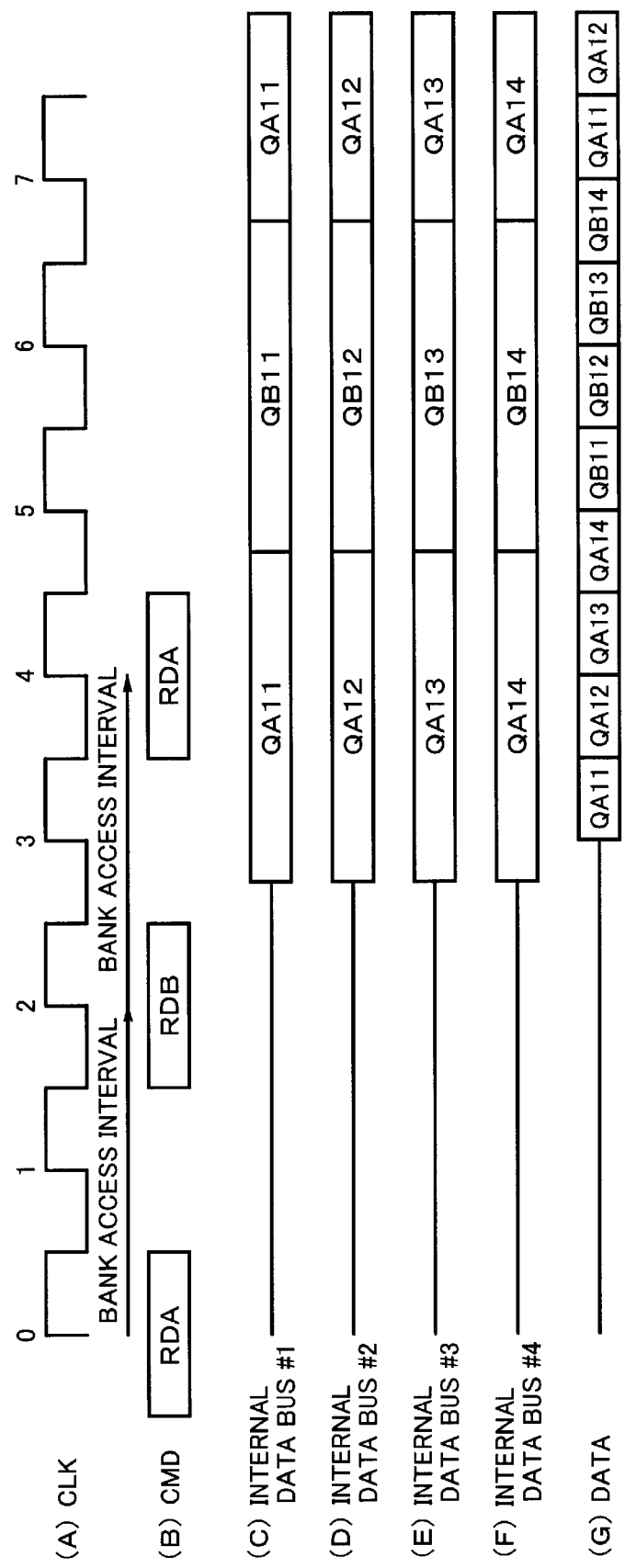
FIG. 23 is a timing chart showing an example of another type of operation in the embodiment shown in FIG. 16.

When an RDA command is input at the zeroth leading edge of a CLK signal shown in FIG. 23(A) after burst length being set to "4," the CMD decoder 207 detects it and informs the burst length counter 209 of it.

The burst length counter 209 provides a RESET signal to the burst address generating circuit 250. As a result, the burst address generating circuit 250 obtains a leading address for a burst transfer from the ADD input circuit 206, generates a BADD, and provides it to the bankA 230 and bankB 240 via the address importing circuit 251.

The burst length counter 209 keeps an enable signal it provides to the CMD decoder 207 in the "L" state, so decoding a new command will be prohibited.

The operation in this example corresponds to a case gyp where an RDA command is input, and the bankA 230 is selected. Therefore, the NBA# signal shown in FIG. 18 is in the "H" state and the BA# signal shown in FIG. 19 is in the "L" state. As a result, all of the MOS switches 290 through 297 in the bankB 240 shown in FIG. 19 go into the OFF state and output from the bankB 240 is stopped.

On the other hand, in the bankA 230 shown in FIG. 18, output from the inverter 260 is "L," so output from the AND elements 274 and 275 goes into the "L" state. The BL4 signal is in the "H" state, so output from the OR elements 270 and 271 goes into the "H" state. The MOS switches 280, 281, 286, and 287 therefore go into the ON state.

At this time, the BL4 signal is provided to the OR elements 272 and 273, so output from them is in the "H" state. The NBA# signal is in the "H" state. All of the MOS switches 290 through 297 therefore go into the ON state.

As a result, as shown in FIGS. 23(C) through 23(F), QA11 through QA14 will be output to the DB#1 through DB#4 respectively.

Next, when an RDB command is input at the second leading edge of the CLK signal, the CMD decoder 207 detects it and informs the burst length counter 209 of it.

The burst length counter 209 provides a RESET signal to the burst address generating circuit 250. As a result, the burst address generating circuit 250 obtains a leading address for a burst transfer from the ADD input circuit 206, generates a BADD, and provides it to the bankA 230 and bankB 240 via the address importing circuit 251.

The operation in this example corresponds to a case where an RDB command is input, and the bankB 240 is selected. Therefore, the NBA# signal shown in FIG. 18 is in the "L" state and the BA# signal shown in FIG. 19 is in the "H" state. As a result, all of the MOS switches 290 through 297 in the bankB 240 shown in FIG. 18 go into the OFF state and output from the bankA 230 is stopped.

On the other hand, in the bankB 240 shown in FIG. 19, output from the inverter 260 is "L," so output from the AND elements 274 and 275 goes into the "L" state. The BL4 signal is in the "H" state, so output from the OR elements 270 and 271 goes into the "H" state. The MOS switches 280, 281, 286, and 287 therefore go into the ON state.

At this time, the BL4 signal is provided to the OR elements 272 and 273, so output from them is in the "H" state. The NBA# signal is in the "H" state. All of the MOS switches 290 through 297 therefore go into the ON state.

As a result, as shown in FIGS. 23(C) through 23(F), QA11 through QA14 will be output to the DB#1 through DB#4 respectively.

This is operation performed in the case of burst length having been set to "4." As stated above, if the burst length has been set to "4," a predetermined bank is selected by a BA# signal or NBA# signal and output a through d will be output to the DB#1 through DB#4 respectively. Therefore, the same operation that is performed in conventional cases can be realized.

By the way, in the above embodiment, a case where inputting a new command during a burst transfer is prohibited (a case where an interrupt is disabled) has been described. Now, operation performed in the case of an interrupt being enabled will be described.

Figure 24:
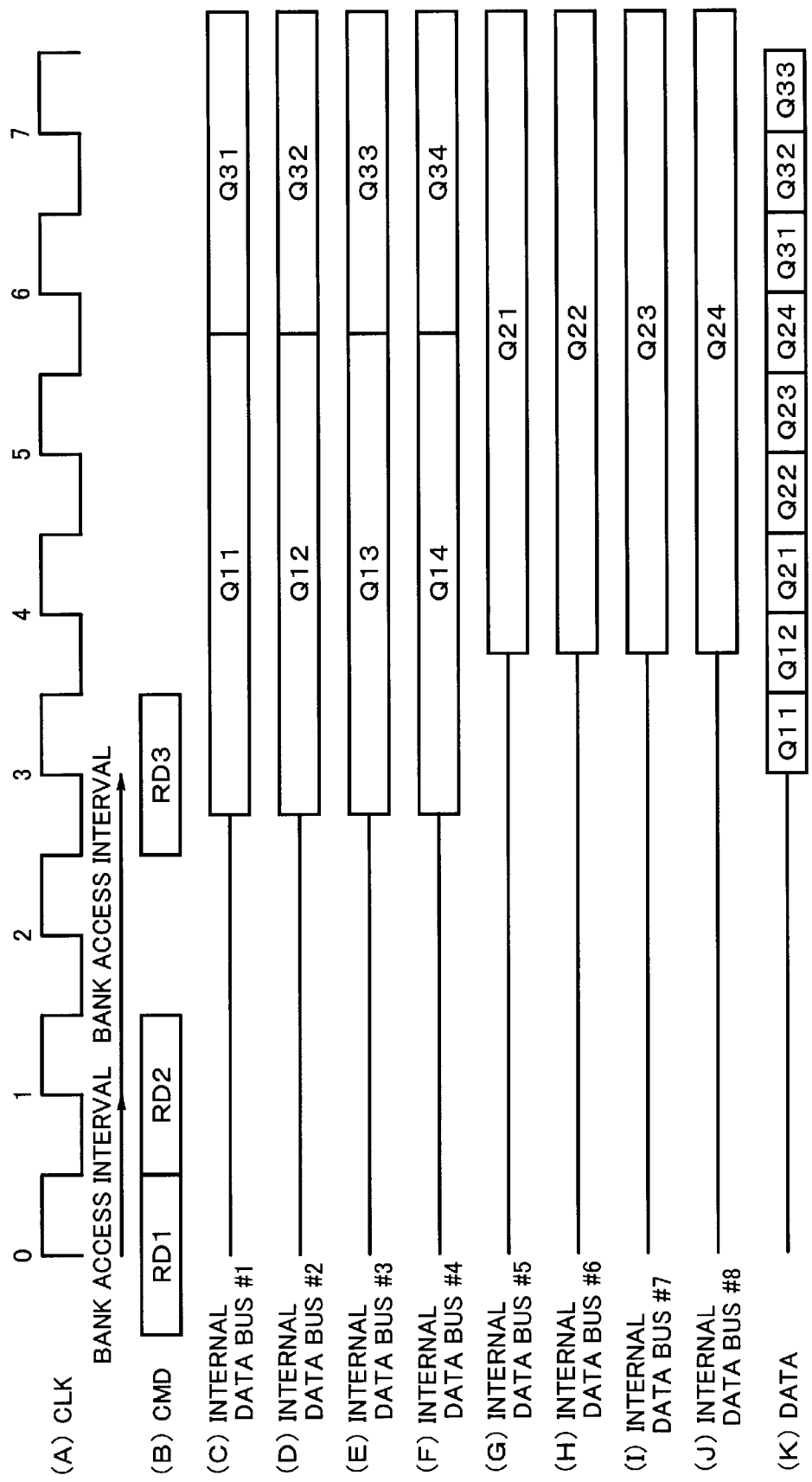
FIG. 24 is a view showing an example of operation performed in the case of an interrupt being enabled.

FIG. 24 is a view for describing operation performed in a semiconductor memory device with a maximum burst length of "8" in the case of burst length being set to "4" and an interrupt being enabled.

In this example, an RD2 command interrupts an RD1 command. As shown in DB#5 through DB#8 (see FIGS. 24(G) through 24(J)), the operation cycle is originally four clocks. However, if an interrupt is enabled in this way, the operation cycle will become three clocks, as shown in DB#1 through DB#4 (see FIGS. 24(C) through 24(F)). That is to say, the margin for operation will become narrower.

Therefore, specifications which do not enable an interrupt should be adopted so that the embodiment of the present invention will produce more effect.

The circuits shown in the above embodiment are simple examples. The present invention is not limited to these circuits, of course.

Moreover, the above embodiment has been described with a case where the maximum burst length is "4" as an example. It is, however, a matter of course that the present invention is also applicable to other cases.

Furthermore, in the above embodiment, the means for prohibiting an interrupt is located inside the semiconductor memory device, but it may be located outside the semiconductor memory device. In that case, the same effect that was described above can be obtained by prohibiting providing a command to the CMD input terminal 202 during a burst transfer.

(Third Embodiment)

Figure 25:
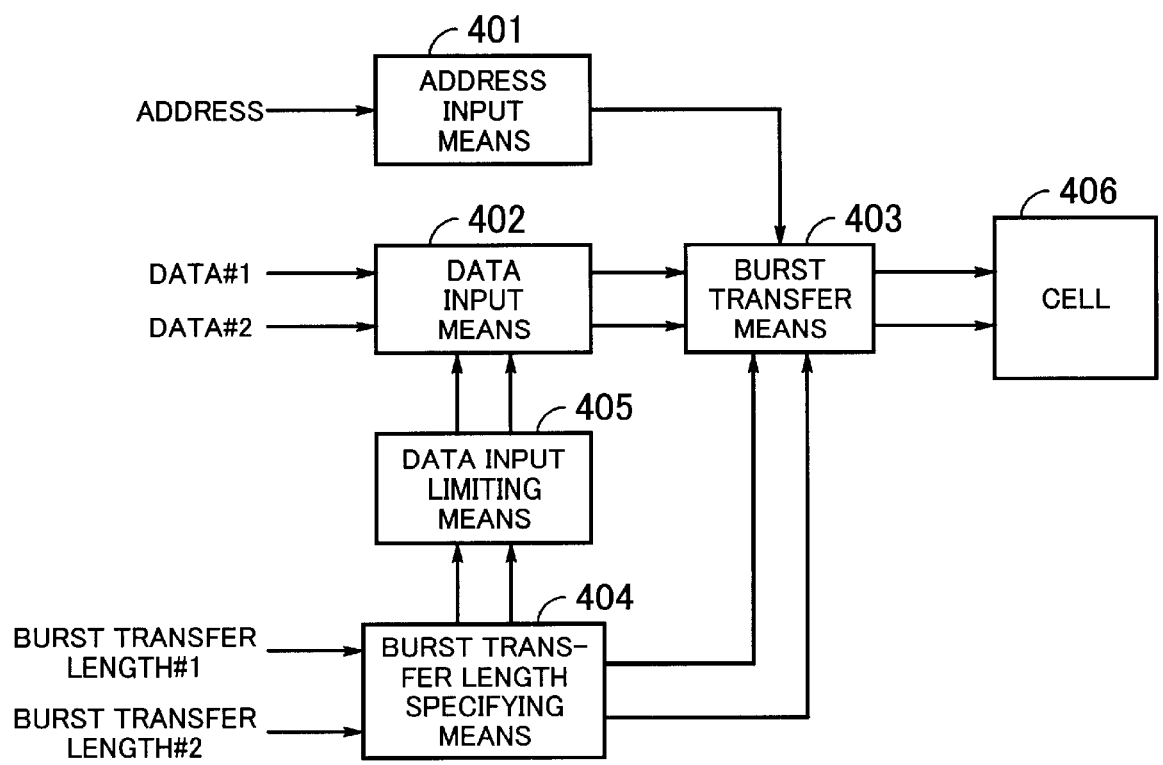
FIG. 25 is a view for describing the operative principles of the present invention.

FIG. 25 is a view for describing the operative principles of the present invention. As shown in FIG. 25, a semiconductor memory device according to the present invention comprises address input means 401, data input means 402, burst transfer means 403, burst transfer length specifying means 404, data input limiting means 405, and a cell 406.

The address input means 401 receives the address of a destination input.

The data input means 402 receives input data to be transferred. In this example, data#1 corresponding to a high-order bit group and data#2 corresponding to a low-order bit group are input.

The burst transfer means 403 performs the burst transfer of the data#1 and data#2 input via the data input means 402 to an area in the cell 406 corresponding to the address input via the address input means 401.

The burst transfer length specifying means 404 receives transfer length specified by the burst transfer means 403. In this example, burst transfer length#1 corresponding to the data #1 and burst transfer length#2 corresponding to the data #2 are input.

If a burst transfer length of "0" is specified by the burst transfer length specifying means 404, the data input limiting means 405 limits data input from the data input means 402.

Operation in FIG. 25 will now be described.

It is assumed that an address which indicates a destination in the case of a burst transfer being performed is input to the address input means 401 and that "4 bits" and "0 bit" are input to the burst transfer length specifying means 404 as burst transfer length#1 and burst transfer length#2 respectively.

The burst transfer means 403 obtains the address of the destination input via the address input means 401 and the burst transfer length#1 and burst transfer length#2 input via the burst transfer length specifying means 404 and sets its internal circuits.

The data input limiting means 405 refers to the burst transfer length#1 and burst transfer length#2 supplied from the burst transfer length specifying means 404. In this case, the burst transfer length#2 has been set to "0," so the data input limiting means 405 requests the data input means 402 to limit the inputting of data#2.

When predetermined time (time corresponding to latency) has elapsed after the address etc. being input, the data input means 402 inputs only data#1 and provides it to the burst transfer means 403.

The burst transfer means 403 performs the burst transfers of only the data#1 supplied from the data input means 402 to a predetermined area in the cell 406 corresponding to the address supplied from the address input means 401.

As a result, only the high-order bit group of data will be transferred to the cell 406. In this example, a case where only a high-order bit group is transferred has been described as an example. Only a low-order bit group, however, can be transferred.

As described above, with a semiconductor memory device according to the present invention, only a high-order bit group or low-order bit group of data can be transferred to a cell.

In the above example, data is divided into a high-order bit group and low-order bit group. Another method for dividing data, however, can be adopted, of course.

Moreover, in the above example, data input is limited according to a burst transfer length. A burst transfer, however, may be limited according to a burst transfer length.

An embodiment of the present invention will now be described.

Figure 26:
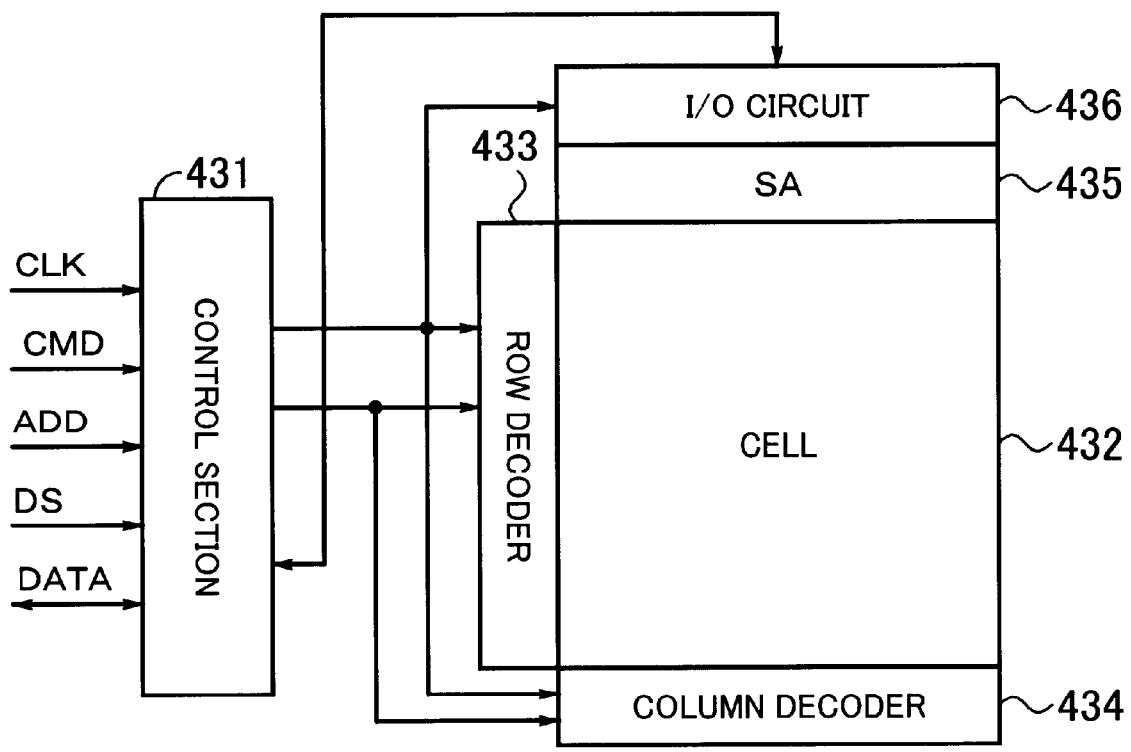
FIG. 26 is a view showing the structure of an embodiment of the present invention.

FIG. 26 is a view showing the structure of a semiconductor memory device according to the present invention. As shown in FIG. 26, a semiconductor memory device according to the present invention comprises a control section 431, a cell 432, a row decoder 433, a column decoder 434, a sense amplifier (SA) 435, and an I/O circuit 436.

The control section 431 inputs a clock (CLK) signal, command (CMD) signal, address (ADD) signal, data strobe (DS) signal, and DATA signal and provides them to each section of the device. Moreover, the control section 431 reads data with predetermined timing in the case of writing. Furthermore, in the case of reading, the control section 431 reads data from a predetermined address and outputs it.

The cell 432 includes a group of storage elements arranged like a matrix and stores input data.

The row decoder 433 specifies a predetermined row in the cell 432 on the basis of a row address.

The column decoder 434 specifies a predetermined column in the cell 432 on the basis of a column address.

The SA 435 amplifies a signal read from the cell 432 by a predetermined gain and converts it to a digital one.

The I/O circuit 436 controls operation regarding inputting and outputting data.

Figure 27:
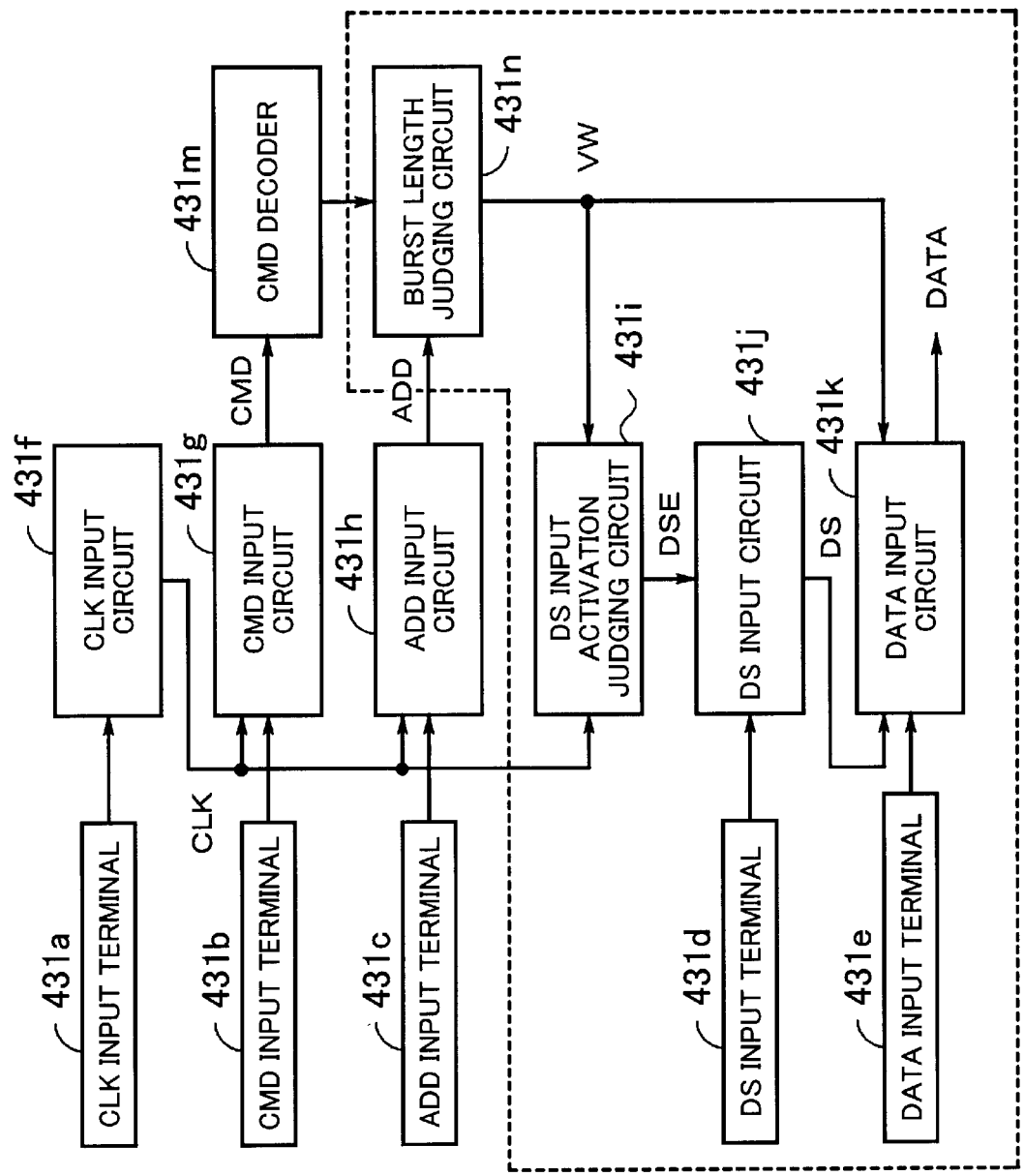
FIG. 27 is a view showing the detailed structure of the control section shown in FIG. 26.

FIG. 27 is a view showing the detailed structure of the control section 431 shown in FIG. 26.

As shown in FIG. 27, the control section 431 comprises a CLK input terminal 431*a*, a CMD input terminal 431*b*, an ADD input terminal 431*c*, a DS input terminal 431*d*, a DATA input terminal 431*e*, a CLK input circuit 431*f*, a CMD input circuit 431*g*, an ADD input circuit 431*h*, a DS input activation judging circuit 431*i*, a DS input circuit 431*j*, a DATA input circuit 431*k*, a CMD decoder 431*m*, and a burst length judging circuit 431*n*. There is another section (not shown) that is the same as the one enclosed with a dashed line in FIG. 27. One of the two sections is for a high-order bit group and the other is for a low-order bit group.

The CLK input terminal 431*a* receives a CLK signal input. The CMD input terminal 431*b* receives a CMD signal input. The ADD input terminal 431*c* receives an ADD signal input. The DS input terminal 431*d* receives a DS signal input. The DATA input terminal 431*e* receives a DATA signal input.

The CLK input circuit 431*f* includes a buffer etc. and provides the CLK signal input from the CLK input terminal 431*a* to the CMD input circuit 431*g*, ADD input circuit 431*h*, and DS input activation judging circuit 431*i*.

In synchronization with the CLK signal, the CMD input circuit 431*g* obtains the CMD signal input from the CMD input terminal 431*b* and provides it to the CMD decoder 431*m*.

In synchronization with the CLK signal, the ADD input circuit 431*h* obtains the ADD signal input from the ADD input terminal 431*c* and provides it to the burst length judging circuit 431*n*.

The DS input activation judging circuit 431*i* makes a data strobe enable (DSE) signal active according to burst length (VW) judged by the burst length judging circuit 431*n*.

When a DSE signal supplied from the DS input activation judging circuit 431*i* becomes active, the DS input circuit 431*j* inputs the DS signal from the DS input terminal 431*d* and provides it to the DATA input circuit 431*k*.

When the DS signal is supplied from the DS input circuit 431*j*, the DATA input circuit 431*k* inputs data from the DATA input terminal 431*e* and provides it to the I/O circuit 436 shown in FIG. 26.

The CMD decoder 431*m* decodes the CMD signal input from the CMD input circuit 431*g*. If it is a command to set burst length (burst length setting command), then the CMD decoder 431*m* provides it to the burst length judging circuit 431*n*.

When a burst length setting command is supplied from the CMD decoder 431*m*, the burst length judging circuit 431*n* judges the burst length by referring to data supplied from the ADD input circuit 431*h* and provides it to the DS input activation judging circuit 431*i*.

Operation in the above embodiment will now be described. Basic operation in this embodiment will be briefly described first with reference to FIG. 28, then detailed operation will be described with reference to FIG. 29.

Figure 28:
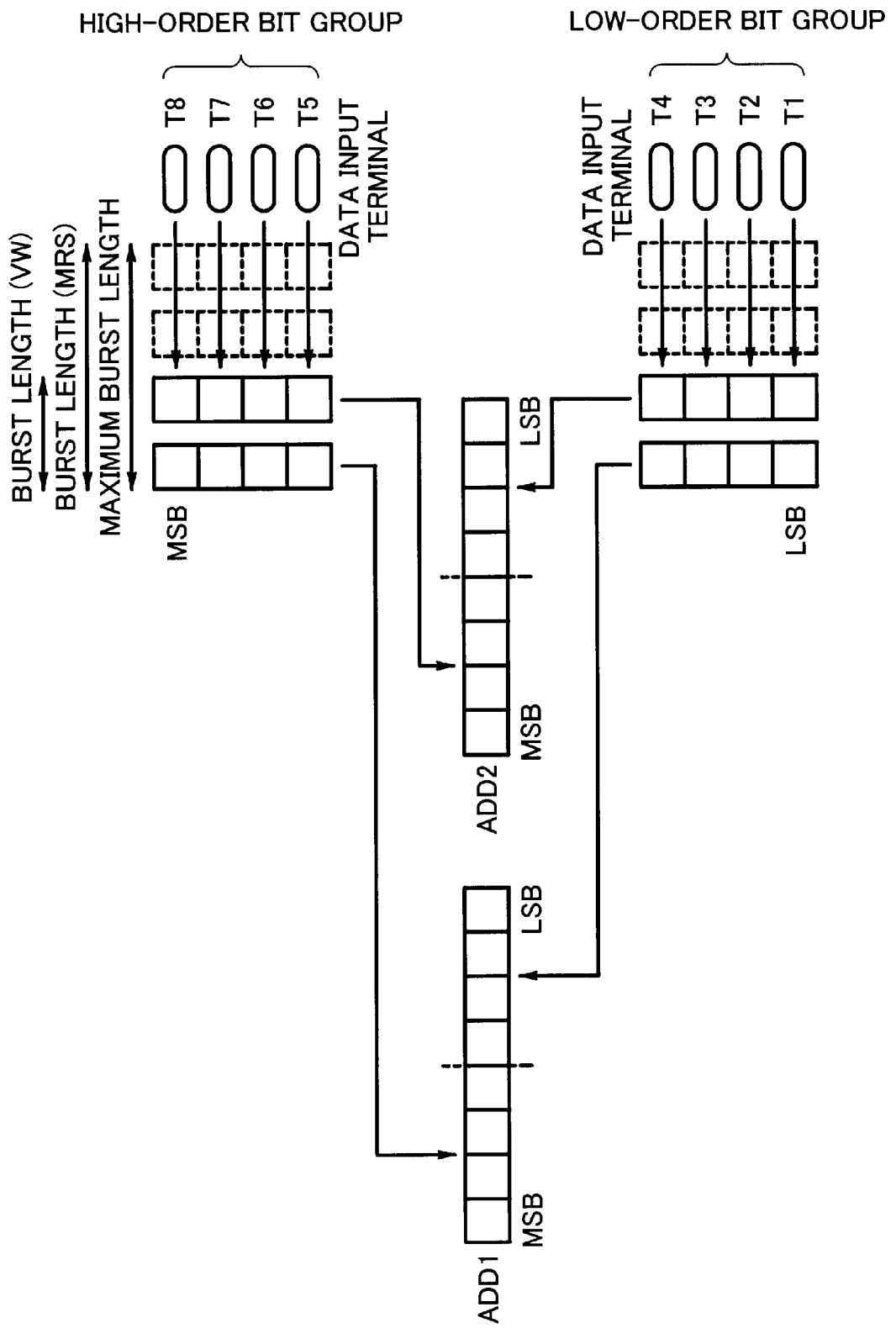
FIG. 28 is a view showing the correspondence between data input from a DATA input terminal in the present invention and data stored in a cell.

FIG. 28 is a view showing how to transfer data from a DATA input terminal (corresponding to the DATA input terminal 431*e* shown in FIG. 27) to a cell (corresponding to the cell 432 shown in FIG. 26).

As shown in FIG. 28, 8-bit data input to DATA input terminals T1 through T8 is divided into a high-order bit group and low-order bit group and is stored as high-order bit groups and low-order bit groups at consecutive addresses ADD1 and ADD2.

The maximum burst length is physical burst length and depends on the structure of a semiconductor memory device. A burst length (mode register set (MRS)) is set by an MRS command for initializing provided at the time of, for example, starting a device. A burst length (VW) is specified by a VW command at the time of writing data and is shorter than or equal to the burst length set by the above MRS command.

FIG. 28 shows a case where 8-bit data is input as an example for the sake of simplicity. In this embodiment, however, 16-bit data is input and is divided into high-order 8 bits and low-order 8 bits.

Detailed operation in this embodiment will now be described.

When the semiconductor memory device shown in FIG. 26 is started, a control unit (not shown) provides a command to set the burst length to "4" to the CMD input terminal 431b.

The CMD decoder 431m obtains the burst length setting command via the CMD input circuit 431g and detects that a request to set a burst length was made.

Then the control unit provides data which represents "4," being a value burst length is to be set to, to the ADD input terminal 431c.

The burst length judging circuit 431n obtains this data via the ADD input circuit 431h, judges that the burst length is "4," and informs the DS input activation judging circuit 431i and DATA input circuit 431k that BL=4. Furthermore, the CMD decoder 431m sets the I/O circuit 436 so that the burst length will be "4."

Now the setting of the burst length (burst length (MRS) shown in FIG. 28) has been completed.

Figure 29:
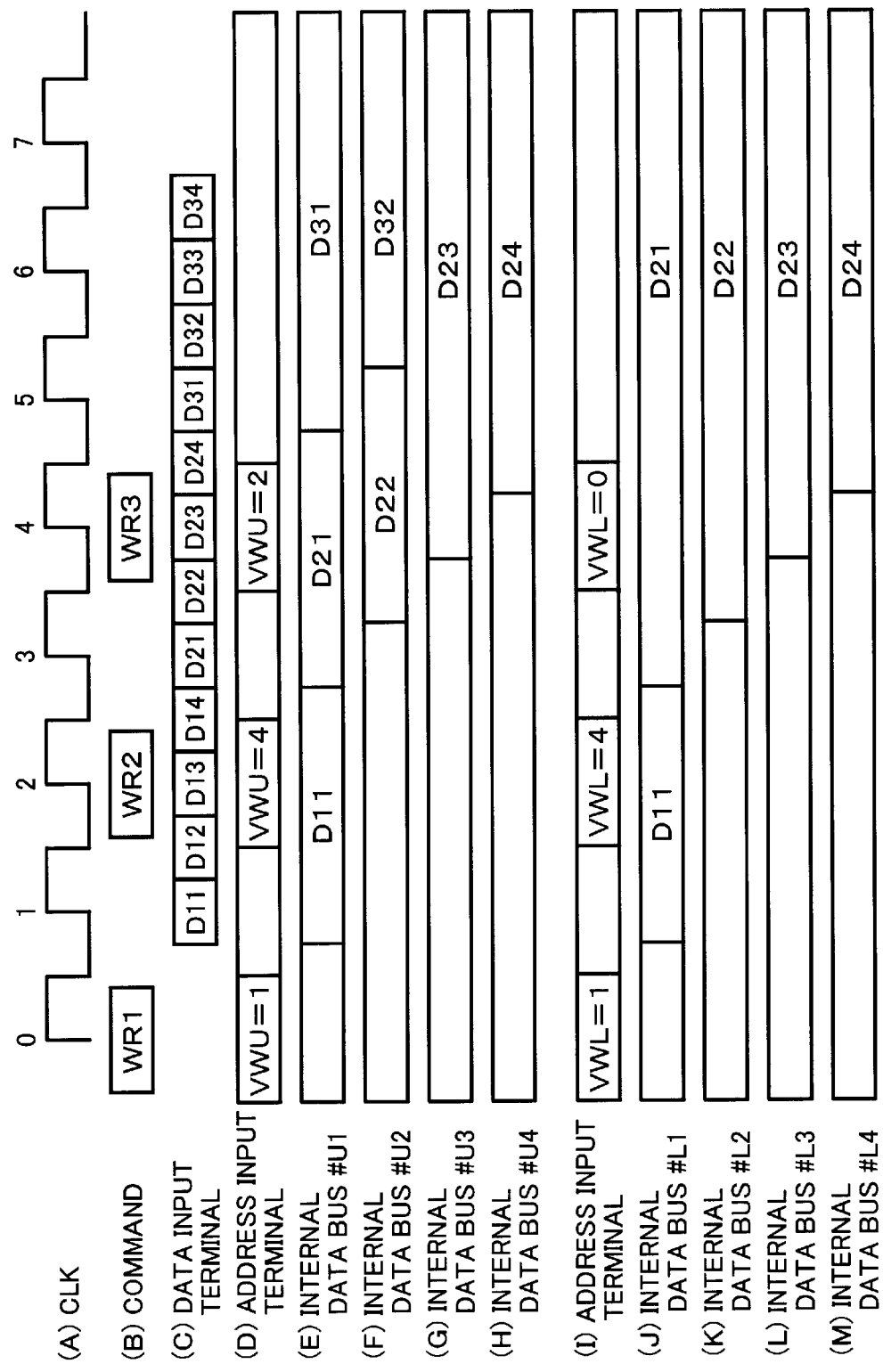
FIG. 29 is a view for describing operation in the embodiment of the present invention.
Figure 34:
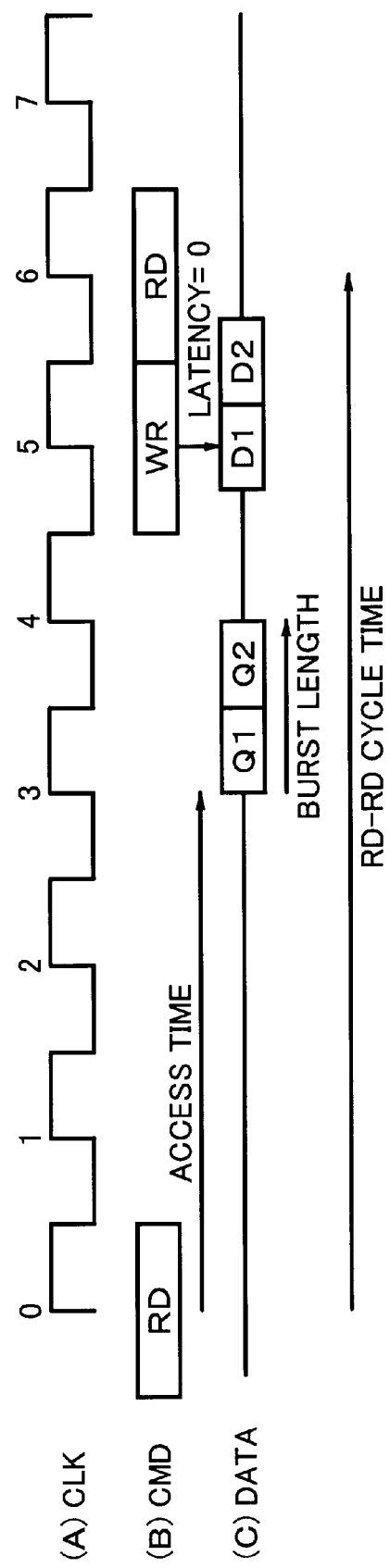
FIG. 34 is a timing chart for describing an example of transfer operation in a conventional semiconductor memory device in the case of write latency not being set.
Figure 35:
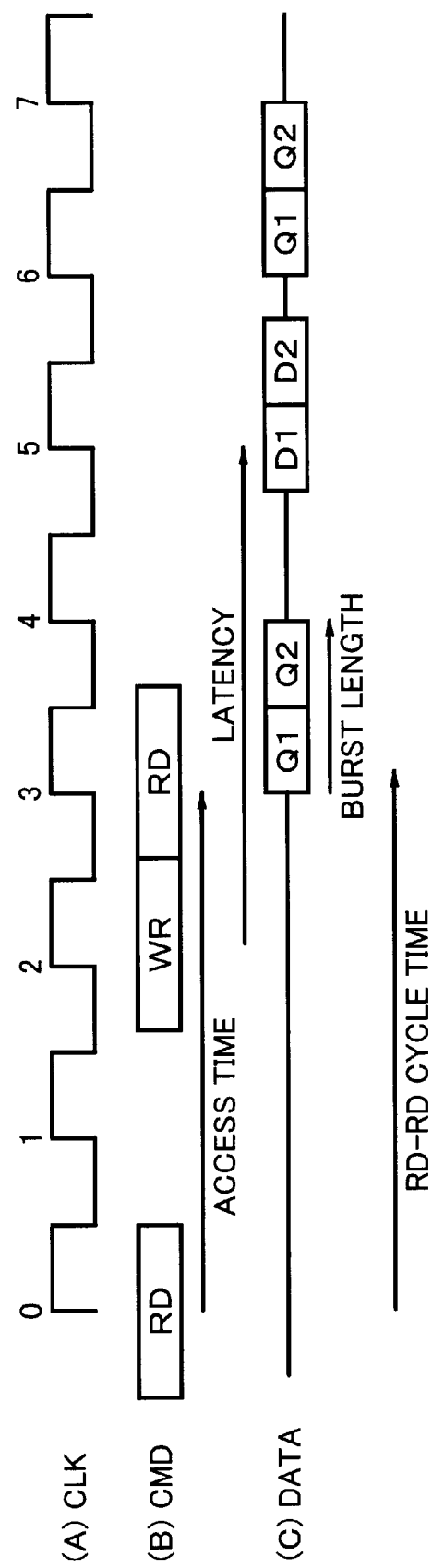
FIG. 35 is a timing chart for describing an example of transfer operation in a conventional semiconductor memory device in the case of write latency being set.
Figure 36:
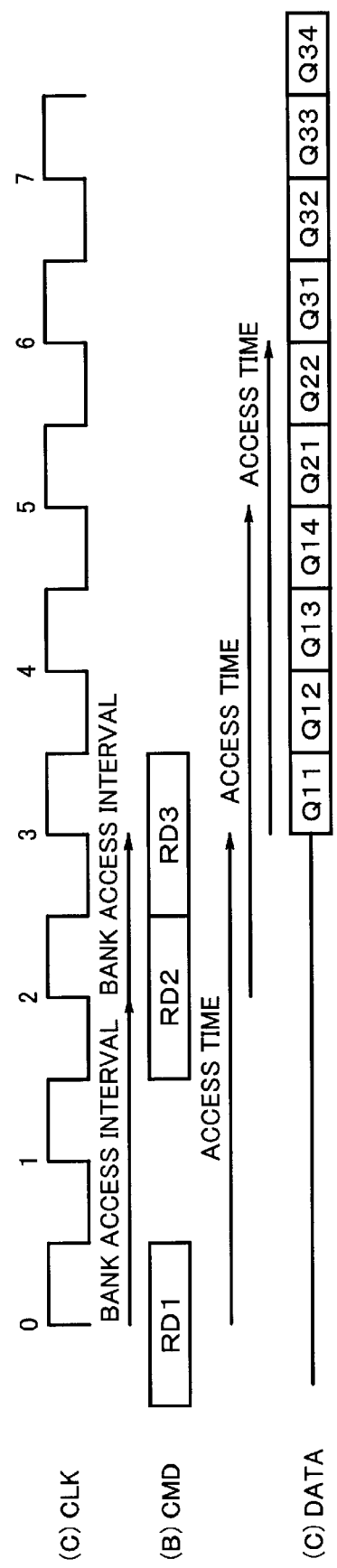
FIG. 36 is a timing chart showing operation for conventional bank interleaving shown in FIG. 37.
Figure 37:
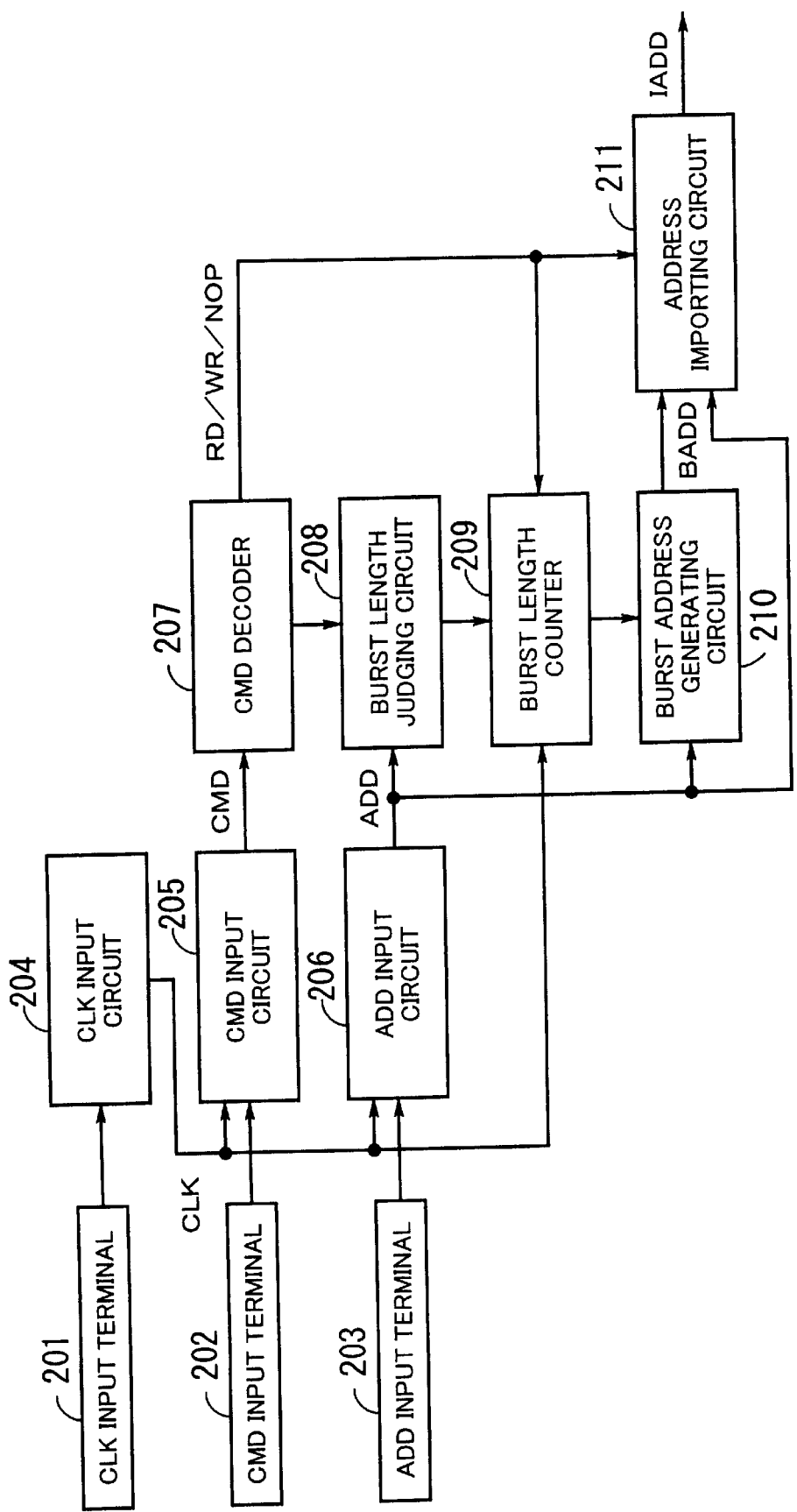
FIG. 37 is a view showing an example of circuits for realizing the conventional bank interleaving.
Figure 38:
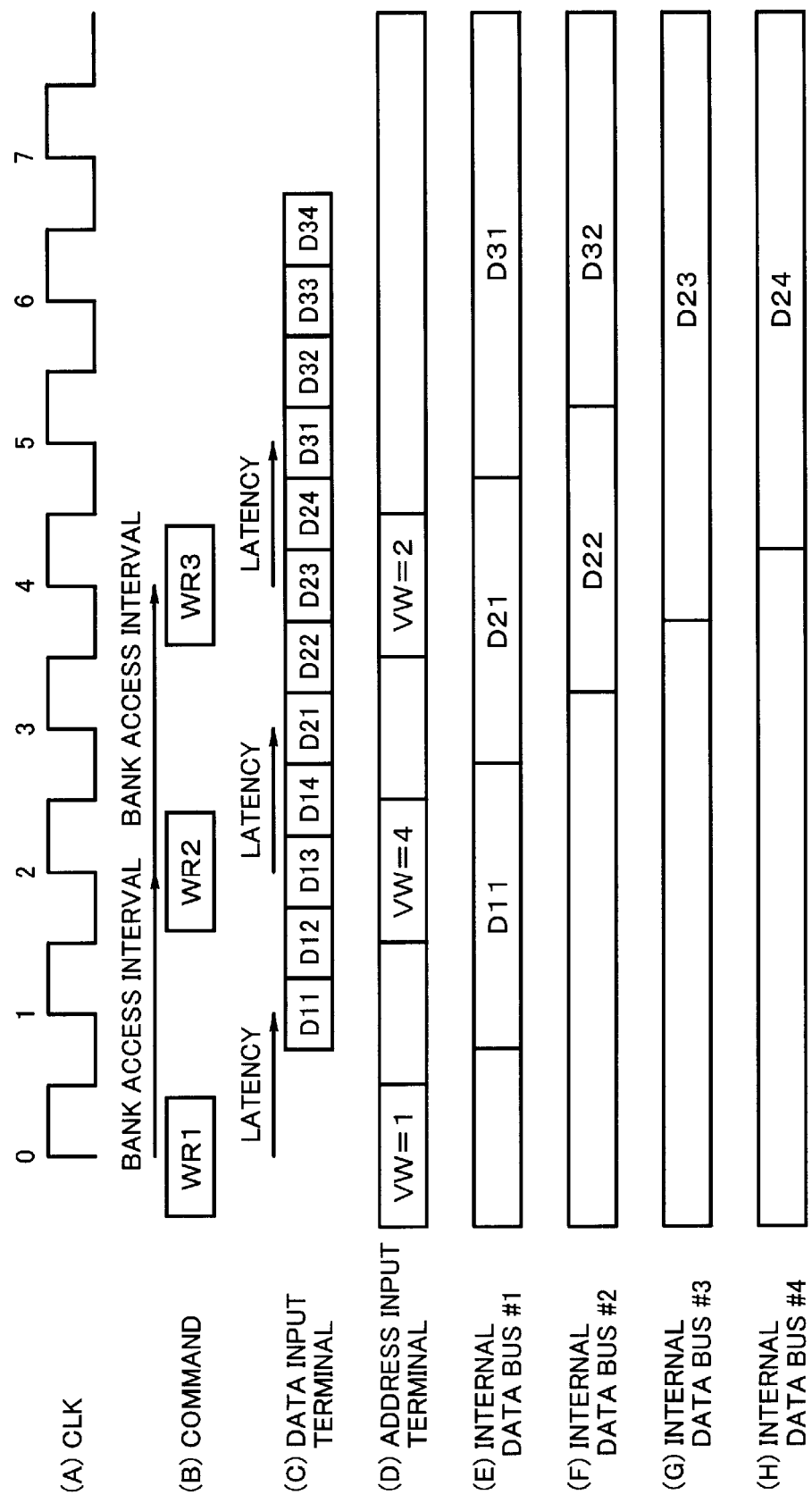
FIG. 38 is a view for describing the operation of a conventional semiconductor memory device for which the burst length of data to be written can be set.

With reference to FIG. 29, operation for writing data in the case of burst length having been set to "4" by an MRS command will now be described.

It is assumed that a WR1 command (COMMAND) (see FIG. 29(B)) is input to the CMD input terminal 431b at the zeroth leading edge of a CLK signal shown in FIG. 29(A) and that VWU=1 (see FIG. 29(D)) and VWL=1 (see FIG. 29(I)) are input. VWU (variable write upper) is a command to set the burst length of high-order 8 bits and VWL (variable write lower) is a command to set the burst length of low-order 8 bits.

The CMD input circuit 431g provides the command input from the CMD input terminal 431b to the CMD decoder 431m.

The CMD decoder 431m decodes the command, detects that a request to write data was made, and informs the burst length judging circuit 431n of it.

As shown in FIG. 28, 8-bit data input to DATA input terminals T1 through T8 is divided into a high-order bit group and low-order bit group and is stored as high-order bit groups and low-order bit groups at consecutive addresses ADD1 and ADD2. Each of the addresses ADD1 and ADD2 has a Most Significant Bit (MSB) and Least Significant Bit (LSB). The request for writing and VWU are provided to circuits corresponding to high-order 8 bits (high-order bit circuits) by the CMD decoder 431m. The request for writing and VWL are provided to circuits corresponding to low-order 8 bits (low-order bit circuits) by the CMD decoder 431m.

The high-order bit circuits and low-order bit circuits will now be described separately.

(1) Operation of the High-Order Bit Circuits

The burst length judging circuit 431n in the high-order bit circuits recognizes by the request from the CMD decoder 431m that a request to write data was made, recognizes a value (=1) to which the burst length should be set by the VWU obtained via the ADD input circuit 431h, and informs the DS input activation judging circuit 431i and DATA input circuit 431k of this value.

When predetermined time (time corresponding to write latency) has elapsed after the request for writing having been made, the DS input activation judging circuit 431i changes a data strobe enable (DSE) signal into the "H" state. As a result, the DS input circuit 431j accepts a DS signal input from the DS input terminal 431d and provides it to the DATA input circuit 431k.

When the DS signal is supplied from the DS input circuit 431j, the DATA input circuit 431k begins to input the high-order 8 bits of data from the DATA input terminal 431e, as shown in FIG. 29(C).

The VWU has been set to "1," so the DATA input circuit 431k transfers only the high-order 8 bits of the data D11 from among input data D11 through D14 to the I/O circuit 436 via internal data bus #U1 (see FIGS. 29(E) through 29(H)).

(2) Operation of the Low-Order Bit Circuits

On the other hand, the burst length judging circuit 431n in the low-order bit circuits recognizes by the request from the CMD decoder 431m that a request to write data was made, recognizes a value (=1) to which the burst length should be set by the VWL obtained via the ADD input circuit 431h, and informs the DS input activation judging circuit 431i and DATA input circuit 431k of this value.

When predetermined time (time corresponding to write latency) has elapsed after the request for writing having been made, the DS input activation judging circuit 431i changes a DSE signal into the "H" state. As a result, the DS input circuit 431j accepts a DS signal input from the DS input terminal 431d and provides it to the DATA input circuit 431k.

When the DS signal is supplied from the DS input circuit 431j, the DATA input circuit 431k begins to input the low-order 8 bits of data from the DATA input terminal 431e, as shown in FIG. 29(C).

The VWL has been set to "1," so the DATA input circuit 431k in the low-order bit circuits transfers only the low-order 8 bits of the data D11 from among input data D11 through D14 to the I/O circuit 436 via internal data bus #L1 (see FIGS. 29(J) through 29(M)).

This is the operation of the high-order bit circuits and low-order bit circuits in the case of the WR1 command having been input.

Subsequently, when a WR2 command is input at the second leading edge of the CLK signal shown in FIG. 29(A) and VWU=4 and VWL=4 are input, the same operation that is described above is performed and data D21 through D24 are read at the third leading edge of the CLK signal.

VWU=4, so the DATA input circuit 431k in the high-order bit circuits transfers the high-order 8 bits of the data D21 through D24 to the I/O circuit 436 via internal data buses #U1 through #U4 respectively (see FIGS. 29(E) through 29(H)).

Moreover, VWL=4, so the DATA input circuit 431k in the low-order bit circuits transfers the low-order 8 bits of the data D21 through D24 to the I/O circuit 436 via internal data buses #L1 through #L4 respectively (see FIGS. 29(J) through 29(M)).

Subsequently, when a WR3 command is input at the third leading edge of the CLK signal shown in FIG. 29(A) and VWU=2 and VWL=0 are input, the same operation that was described above is performed and data D31 through D34 are read at the fifth leading edge of the CLK signal.

VWU=2, so the DATA input circuit 431k in the high-order bit circuits transfers the high-order 8 bits of the data D31 and D32 to the I/O circuit 436 via the internal data buses #U1 and #U2 respectively (see FIGS. 29(E) through 29(H)).

Moreover, VWL=0, so the DATA input circuit 431k in the low-order bit circuits does not transfer data to the I/O circuit 436 (see FIGS. 29(J) through 29(M)). As a result, the low-order bytes will not written to the cell 432.

As stated above, writing a high- or low-order byte can be reserved by setting a VWU or VWL to "0."

In the above example, writing the low-order byte of data is reserved. However, writing the high-order byte of data can also be reserved. In that case, WVU=0 should be input. Then the same operation that was described above will be performed and writing the high-order byte of data will be reserved.

By the way, there are not dedicated addresses for specifying a VWU or VWL. Usually free addresses are used. For example, it is assumed that a row address and column address are imported one at a time. Usually the number of bits used for a column address is smaller than that of bits used for a row address, so some of address terminals prepared for the row address will be free at the time of the column address being imported. As shown in FIGS. 30 through 33, for example, these free addresses can be assigned to a VWU and VWL.

FIG. 30 is a view showing an example of assigning a VWU and VWL to column addresses in the case of burst length being "2"(BL=2). In this example, a VWU for a high-order byte is assigned to A0 and A1 and a VWL for a low-order byte is assigned to A2 and A3. To be concrete, if A0 and A1 are "0" and "0" respectively, then VWU=0; if A0 and A1 are "1" and "0" respectively, then VWU=1; if A0 and A1 are "0" and "1" respectively, then VWU=2 is assigned. This is the same with a VWL for a low-order byte.

FIG. 31 is a view showing an example of assigning a VWU and VWL to column addresses in the case of burst length being "4"(BL=4). In this example, a VWU for a high-order byte is assigned to A0 and A1 and a VWL for a low-order byte is assigned to A2 and A3. To be concrete, if A0 and A1 are "0" and "0" respectively, then VWU=0; if A0 and A1 are "1" and "0" respectively, then VWU=1; if A0 and A1 are "0" and "1" respectively, then VWU=2; if A0 and A1 are "1" and "1" respectively, then VWU=4 is assigned. This is the same with a VWL for a low-order byte.

FIG. 32 is a view showing an example of assigning a VWU and VWL to column addresses in the case of burst length being "8"(BL=8). In this example, a VWU for a high-order byte is assigned to A0 through A2 and a VWL for a low-order byte is assigned to A3 through A5. To be concrete, if A0, A1, and A2 are "0," "0," and "0" respectively, then VWU=0; if A0, A1, and A2 are "1," "0," and "0" respectively, then VWU=1; if A0, A1, and A2 are "0," "1," and "0" respectively, then VWU=2; if A0, A1, and A2 are "1," "1," and "0" respectively, then VWU=4; if A0, A1, and A2 are "0," "0," and "1" respectively, then VWU=8 is assigned. This is the same with a VWL for a low-order byte.

FIG. 33 is a view showing an example of assigning a VWU and VWL to column addresses in the case of burst length being "16"(BL=16). In this example, a VWU for a high-order byte is assigned to A0 through A2 and a VWL for a low-order byte is assigned to A3 through A5. To be concrete, if A0, A1, and A2 are "0," "0," and "0" respectively, then VWU=0; if A0, A1, and A2 are "1," "0," and "0" respectively, then VWU=1; if A0, A1, and A2 are "0," "1," and "0" respectively, then VWU=2; if A0, A1, and A2 are "1," "1," and "0" respectively, then VWU=4; if A0, A1, and A2 are "0," "0," and "1" respectively, then VWU=8; if A0, A1, and A2 are "1," "0," and "1" respectively, then VWU=16 is assigned. This is the same with a VWL for a low-order byte.

As described above, in this embodiment, a burst length can be set to "0" by a VWU or VWL, so the transfer of a high- or low-order byte can be reserved. Therefore, either a high-order byte or a low-order byte can be written to the cell 432.

Furthermore, in this embodiment, writing both of a high- and low-order byte can be reserved by a VWU and VWL. Such a transfer mode is considered to be effective in, for example, running a performance test on a semiconductor memory device with write latency.

That is to say, with a semiconductor memory device with write latency, if a command to write to an address is provided, only the process of importing data to be written input after the command being input is performed in that cycle. When the next write command is input, the data will actually be written to the cell 432.

Therefore, when a performance test is run on such a semiconductor memory device, a command to write to an address is input first, then a dummy write command must be input to complete the writing of data previously input. In that case, dummy data can have an influence on the data previously input, so the dummy data should be written with a VWU and VWL set to "0." Then the dummy data will not be transferred to the cell 432 and such a problem can be avoided.

In the above embodiment, if a VWU or VWL is "0," the transfer of data to the cell 432 is reserved. However, the same effect that was described above can be obtained by prohibiting importing data from the DATA input terminal 431e, which is the same as that shown in FIG. 26.

Moreover, in the above embodiment, data is divided into a high-order bit group and low-order bit group and a VW for each bit group is provided. However, another method for dividing data can be adopted, of course.

The structures shown in FIGS. 26 and 27 are simple examples. It is a matter of course that the present invention is not limited to such cases.

As has been described in the foregoing, a semiconductor memory device having a burst mode in which a plurality of bits of data are transferred consecutively in response to an external command, according to the present invention, comprises transfer means for transferring data in the burst mode, transferred number setting means for setting the number of the plurality of bits of data transferred in the burst mode, write command input means for receiving an input write command, timing means for measuring time which has elapsed after the write command being input, and write start time setting means for setting time which elapses before the writing of data being begun, according to the number of bits of data set by the transferred number setting means. This enables to transfer data efficiently.

Furthermore, an information processing unit comprises a semiconductor memory device with a burst mode, in which a plurality of bits of data are consecutively transferred in block in response to an external command, including transferred number setting means for setting the number of the plurality of bits of data transferred in the burst mode, write command input means for receiving an input write command, timing means for measuring time which has elapsed after the write command being input, and write start time setting means for setting time which elapses before the writing of data being begun, according to the number of bits of data set by the transferred number setting means and transferred number specifying means for providing a predetermined command to the transferred number setting means to specify the number of the plurality of bits of data. This enables to improve the processing speed of an information processing unit.

As has been described in the foregoing, a semiconductor memory device with a plurality of banks having a burst transfer mode in which a plurality of bits of data in a predetermined bank are accessed consecutively by inputting a single command, according to the present invention, comprises command input means for receiving the command input, bank selection means for selecting a predetermined bank corresponding to the command, burst transfer means for performing a burst transfer with a bank selected by the bank selection means as a target, and command input prohibition means for prohibiting the command input means from receiving a new command input in the case of a burst transfer being begun by the burst transfer means. This enables to realize stable operation even at the time of high-speed operation.

Furthermore, a semiconductor memory device with a plurality of banks comprises a bus with a width of n bits for connecting the plurality of banks to one another, first data transfer means for transferring data between the first data transfer means and a predetermined bank by the use of part of the bus with a width of n bits, and second data transfer means for transferring data between the second data transfer means and another bank by the use of part or all of bits not used by the first bank. This enables stable operation even in the case of burst length being set to a value smaller than the maximum burst length.

In addition, an information processing system comprises a semiconductor memory device with a plurality of banks having a burst transfer mode, in which a plurality of bits of data in a predetermined bank are accessed consecutively by inputting a single command, including command input means for receiving the command input, bank selection means for selecting a predetermined bank corresponding to the command, and burst transfer means for performing a burst transfer with a bank selected by the bank selection means as a target and command provision prohibiting means located outside the semiconductor memory device for prohibiting the command input means from providing a new command in the case of a burst transfer being begun by the burst transfer means. This enables to provide an information processing system which operates stably even at the time of high-speed operation.

As has been described in the foregoing, a semiconductor memory device with a burst transfer mode in which a plurality of bits of data are transferred consecutively by specifying one address, according to the present invention, comprises address input means for receiving the address input, data input means for receiving the plurality of bits of data input, burst transfer means for performing the burst transfer of the plurality of bits of data input via the data input means to a cell area corresponding to the address input via the address input means, burst transfer length specifying means for receiving transfer length specified by the burst transfer means, and data input limiting means for limiting data input from the data input means in the case of a burst transfer length of "0" being specified by the burst transfer length specifying means. This enables to prevent bits of data written from interfering with each other in the case of running a performance test on a semiconductor memory device.

Furthermore, a semiconductor memory device with a burst transfer mode, in which a plurality of bits of data are transferred consecutively by specifying one address, comprises address input means for receiving the address input, data input means for receiving the plurality of bits of data input, burst transfer means for performing the burst transfer of the plurality of bits of data input via the data input means to a cell area specified by the address input via the address input means, burst transfer length specifying means for receiving transfer length specified by the burst transfer means, and transfer limiting means for limiting a transfer by the burst transfer means in the case of a burst transfer length of "0" being specified by the burst transfer length specifying means. This enables to write part of data.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device having a burst mode in which a plurality of bits of data are transferred consecutively in response to an external command, the device comprising:
    a transfer section for transferring data in the burst mode;
    a transferred number setting section for setting the number of the plurality of bits of data transferred in the burst mode;
    a write command input section for receiving an input write command;
    a timing section for measuring time which has elapsed after the write command being input; and
    a write start time setting section for setting time which elapses before the writing of data being begun, according to the number of bits of data set by the transferred number setting section.

2. The semiconductor memory device according to claim 1, wherein a data input terminal to which data to be written is input is also used as a data output terminal from which read data is output.

3. The semiconductor memory device according to claim 1, wherein the write start time setting section determines write start time according to predetermined time fixed independently of the number of bits of data and time which depends on the number of the bits of data.

4. The semiconductor memory device according to claim 1, wherein the transferred number setting section sets the number of bits of data transferred in compliance with a command supplied from the outside.

5. The semiconductor memory device according to claim 1, wherein the timing section measures time in compliance with a clock signal supplied from the outside.

6. An information processing unit comprising:
    a semiconductor memory device with a burst mode in which a plurality of bits of data are consecutively transferred in block in response to an external command, the device including:
        a transferred number setting section for setting the number of the plurality of bits of data transferred in the burst mode,
        a write command input section for receiving an input write command,
        a timing section for measuring time which has elapsed after the write command being input, and
        a write start time setting section for setting time which elapses before the writing of data being begun, according to the number of bits of data set by the transferred number setting section; and a transferred number specifying section for providing a predetermined command to the transferred number setting section to specify the number of the plurality of bits of data.

7. A semiconductor memory device with a plurality of banks having a burst transfer mode in which a plurality of bits of data in a predetermined bank are accessed consecutively by inputting a single command, the device comprising:

a command input section for receiving the command input;

a bank selection section for selecting a predetermined bank corresponding to the command;

a burst transfer section for performing, based on a signal received from the command input section, a burst transfer with a bank selected by the bank selection section as a target; and a command input prohibition section for prohibiting the command input section from receiving a new command input in a case of a burst transfer being begun by the burst transfer section.

8. The semiconductor memory device according to claim 7, wherein the command input prohibition section prohibits accepting a new command input by changing a cycle in which each bank is accessed according to the number of bits of data transferred by the burst transfer.

9. An information processing system comprising:

a semiconductor memory device with a plurality of banks having a burst transfer mode in which a plurality of bits of data in a predetermined bank are accessed consecutively by inputting a single command, the device including:

a command input section for receiving the command input, a bank selection section for selecting a predetermined bank corresponding to the command, and a burst transfer section for performing, based on a signal received from the command input section, a burst transfer with a bank selected by the bank selection section as a target; and a command provision prohibiting section located outside the semiconductor memory device for prohibiting the command input section from providing a new command in a case of a burst transfer being begun by the burst transfer section.

10. The information processing system according to claim 9, wherein the command provision prohibiting section prohibits providing a new command by changing a cycle in which each bank is accessed according to the number of bits of data transferred by the burst transfer.

11. The information processing system according to claim 9, wherein the semiconductor memory device further comprising:

a bus with a width of n bits for connecting the plurality of banks to one another;

a first data transfer section for transferring data between the first data transfer section and a predetermined bank by using part of the bus with said width of n bits; and a second data transfer section for transferring data between the second data transfer section and another bank by using part or all of bits not used by the first bank.

12. A semiconductor memory device with a burst transfer mode in which a plurality of bits of data are transferred consecutively by specifying one address, the device comprising:

an address input section for receiving the address input;

a data input section for receiving the plurality of bits of data input;

a burst transfer section for performing a burst transfer of the plurality of bits of data input via the data input section to a cell area corresponding to the address input via the address input section;

a burst transfer length specifying section for receiving transfer length specified by the burst transfer section; and a data input limiting section for limiting data input from the data input section in a case of a burst transfer length of "0" being specified by the burst transfer length specifying section.

13. The semiconductor memory device according to claim 12, wherein the burst transfer length specifying section can set the burst transfer length of data by a predetermined bit group, further wherein the data input limiting section limits data input by the predetermined bit group.

14. The semiconductor memory device according to claim 12, wherein the data input section begins to input data when predetermined time has elapsed after burst length being specified by the burst transfer length specifying section.

15. A semiconductor memory device with a burst transfer mode in which a plurality of bits of data are transferred consecutively by specifying one address the device comprising:

an address input section for receiving the address input;

a data input section for receiving the plurality of bits of data input;

a burst transfer section for performing the burst transfer of the plurality of bits of data input via the data input section to a cell area specified by the address input via the address input section;

a burst transfer length specifying section for receiving transfer length specified by the burst transfer section; and a transfer limiting section for limiting a transfer by the burst transfer section in a case of a burst transfer length of "0" being specified by the burst transfer length specifying section.

16. The semiconductor memory device according to claim 15, wherein the burst transfer length specifying section can set the burst transfer length of data by a predetermined bit group, further wherein the transfer limiting section limits a data transfer by the predetermined bit group.

17. The semiconductor memory device according to claim 15, wherein the data input section begins to input data when predetermined time has elapsed after burst length being specified by the burst transfer length specifying section.

* * * * *